United States Patent
Xu et al.

(10) Patent No.: US 12,232,320 B2
(45) Date of Patent: *Feb. 18, 2025

(54) WORD LINE STRUCTURE OF THREE-DIMENSIONAL MEMORY DEVICE

(71) Applicant: YANGTZE MEMORY TECHNOLOGIES CO., LTD., Wuhan (CN)

(72) Inventors: Qiang Xu, Wuhan (CN); Fandong Liu, Wuhan (CN); Zongliang Huo, Wuhan (CN); Zhiliang Xia, Wuhan (CN); Yaohua Yang, Wuhan (CN); Peizhen Hong, Wuhan (CN); Wenyu Hua, Wuhan (CN); Jia He, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 0 days.

This patent is subject to a terminal disclaimer.

(21) Appl. No.: 18/236,815

(22) Filed: Aug. 22, 2023

(65) Prior Publication Data
US 2023/0413560 A1 Dec. 21, 2023

Related U.S. Application Data

(60) Continuation of application No. 17/509,891, filed on Oct. 25, 2021, now Pat. No. 11,792,989, which is a (Continued)

(30) Foreign Application Priority Data

Mar. 7, 2017 (CN) .......................... 201710132422.8

(51) Int. Cl.
*H10B 43/27* (2023.01)
*H01L 21/02* (2006.01)
(Continued)

(52) U.S. Cl.
CPC ....... *H10B 43/27* (2023.02); *H01L 21/02164* (2013.01); *H01L 21/76802* (2013.01);
(Continued)

(58) Field of Classification Search
CPC .............. H01L 23/528; H01L 29/1037; H01L 21/76877; H01L 23/5226; H01L 21/76895;
(Continued)

(56) References Cited

U.S. PATENT DOCUMENTS 8,188,517 B2 5/2012 Choi
8,704,288 B2 4/2014 Lee et al.
(Continued)

FOREIGN PATENT DOCUMENTS

CN 101937919 A 1/2011
CN 102468283 A 5/2012
(Continued)

OTHER PUBLICATIONS

International Search Report and Written Opinion of the International Searching Authority directed to related International Patent Application No. PCT/CN2018/077927, mailed Jun. 8, 2018; 8 page.
(Continued)

*Primary Examiner* — Julia Slutsker
(74) *Attorney, Agent, or Firm* — BAYES PLLC

(57) ABSTRACT

A memory device includes a substrate, a stack over the substrate, and a gate line slit extending along a first direction and dividing the stack into two portions. The stack includes a connection portion that connects the two portions of the stack. The connection portion includes at least two sub-connection portions along a second direction perpendicular to the first direction. The gate line slit includes at least two portions along the first direction. Each sub-connection portion is between adjacent two portions of the gate line slit.

18 Claims, 12 Drawing Sheets

Related U.S. Application Data continuation of application No. 16/843,714, filed on Apr. 8, 2020, now Pat. No. 11,222,903, which is a division of application No. 16/046,814, filed on Jul. 26, 2018, now Pat. No. 10,651,192, which is a continuation of application No. PCT/CN2018/077927, filed on Mar. 2, 2018.

(51) Int. Cl.

| | |
|---|---|
| *H01L 21/285* | (2006.01) |
| *H01L 21/3105* | (2006.01) |
| *H01L 21/311* | (2006.01) |
| *H01L 21/768* | (2006.01) |
| *H01L 23/522* | (2006.01) |
| *H01L 23/528* | (2006.01) |
| *H01L 23/532* | (2006.01) |
| *H01L 29/08* | (2006.01) |
| *H01L 29/10* | (2006.01) |
| *H10B 43/10* | (2023.01) |
| *H10B 43/30* | (2023.01) |
| *H10B 43/35* | (2023.01) |
| *H10B 43/40* | (2023.01) |
| *H10B 43/50* | (2023.01) |

(52) U.S. Cl.
CPC .. *H01L 21/76877* (2013.01); *H01L 21/76895* (2013.01); *H01L 23/5226* (2013.01); *H01L 23/528* (2013.01); *H01L 29/0847* (2013.01); *H01L 29/1037* (2013.01); *H10B 43/10* (2023.02); *H10B 43/30* (2023.02); *H10B 43/35* (2023.02); *H10B 43/40* (2023.02); *H10B 43/50* (2023.02); *H01L 21/02271* (2013.01); *H01L 21/0262* (2013.01); *H01L 21/28568* (2013.01); *H01L 21/31053* (2013.01); *H01L 21/31111* (2013.01); *H01L 21/31144* (2013.01); *H01L 23/53214* (2013.01); *H01L 23/53228* (2013.01); *H01L 23/53257* (2013.01)

(58) Field of Classification Search
CPC ........ H10B 43/10; H10B 43/30; H10B 43/35; H10B 43/40; H10B 43/50
See application file for complete search history.

(56) References Cited

U.S. PATENT DOCUMENTS

| | | | |
|---|---|---|---|
| 8,822,285 | B2 | 9/2014 | Hwang et al. |
| 8,841,729 | B2 | 9/2014 | Kamoshita |
| 8,957,501 | B2 | 2/2015 | Hioka et al. |
| 9,190,514 | B2 | 11/2015 | Lee et al. |
| 9,224,751 | B2 | 12/2015 | Hyun et al. |
| 9,306,041 | B2 | 4/2016 | Hwang et al. |
| 9,331,082 | B2 | 5/2016 | Lee et al. |
| 9,397,043 | B1 | 7/2016 | Minemura |
| 9,419,013 | B1 | 8/2016 | Lee et al. |
| 9,640,549 | B2 | 5/2017 | Lee et al. |
| 9,711,529 | B2 | 7/2017 | Hu et al. |
| 10,115,733 | B2 | 10/2018 | Fukuzumi et al. |
| 10,256,251 | B2 | 4/2019 | Choi et al. |
| 10,388,720 | B2 | 8/2019 | Lue et al. |
| 10,651,192 | B2 | 5/2020 | Xu et al. |
| 11,222,903 | B2 | 1/2022 | Xu et al. |
| 2011/0169071 | A1 | 7/2011 | Uenaka et al. |
| 2011/0266604 | A1 | 11/2011 | Kim et al. |
| 2012/0119283 | A1 | 5/2012 | Lee et al. |
| 2012/0119287 | A1 | 5/2012 | Park et al. |
| 2012/0181602 | A1 | 7/2012 | Fukuzumi et al. |
| 2013/0334589 | A1 | 12/2013 | Ahn |
| 2014/0042519 | A1 | 2/2014 | Lee |
| 2014/0197481 | A1 | 7/2014 | Hwang et al. |
| 2014/0329379 | A1 | 11/2014 | Kim et al. |
| 2015/0001460 | A1 | 1/2015 | Kim et al. |
| 2015/0137216 | A1 | 5/2015 | Lee et al. |
| 2016/0027730 | A1 | 1/2016 | Lee |
| 2016/0329341 | A1 | 11/2016 | Shimabukuro et al. |
| 2018/0130812 | A1 | 5/2018 | Hosoda |
| 2019/0043883 | A1 | 2/2019 | Xu et al. |
| 2020/0243557 | A1 | 7/2020 | Xu et al. |

FOREIGN PATENT DOCUMENTS

| | | |
|---|---|---|
| CN | 103594474 A | 2/2014 |
| CN | 103680611 A | 3/2014 |
| CN | 103681860 A | 3/2014 |
| CN | 104659033 A | 5/2015 |
| CN | 104733462 A | 6/2015 |
| CN | 105990354 A | 10/2016 |
| CN | 106206447 A | 12/2016 |
| CN | 106876397 A | 6/2017 |
| JP | H04372134 A | 12/1992 |
| JP | 2004363230 A | 12/2004 |
| JP | 2010212462 A | 9/2010 |
| JP | 2012146861 A | 8/2012 |
| JP | 2012244180 A | 12/2012 |
| JP | 2013102008 A | 5/2013 |
| JP | 2015149413 A | 8/2015 |
| KR | 1020130072522 A | 7/2013 |
| KR | 10-2014-0063147 A | 5/2014 |
| KR | 1020140093044 A | 7/2014 |
| KR | 1020140122057 A | 10/2014 |
| KR | 1020150002947 A | 1/2015 |
| KR | 1020150057254 A | 5/2015 |
| KR | 1020150113265 A | 10/2015 |

OTHER PUBLICATIONS

Notice of Reasons for Refusal issued in corresponding Japanese Application 2023-009970, dated Apr. 2, 2024, 8 pages.

WORD LINE STRUCTURE OF THREE-DIMENSIONAL MEMORY DEVICE

CROSS-REFERENCES TO RELATED APPLICATIONS

This application is a continuation of U.S. application Ser. No. 17/509,891, filed on Oct. 25, 2021, issued as U.S. Pat. No. 11,792,989, which is a continuation of U.S. application Ser. No. 16/843,714, filed on Apr. 8, 2020, issued as U.S. Pat. No. 11,222,903, which is a divisional of U.S. application Ser. No. 16/046,814, filed on Jul. 26, 2018, issued as U.S. Pat. No. 10,651,192, which is a continuation of International Application No. PCT/CN2018/077927, filed on Mar. 2, 2018, which claims the benefit of priority to C.N. Application No. 201710132422.8, filed on Mar. 7, 2017, all of which are incorporated herein by reference in their entireties.

BACKGROUND

Flash memory devices have undergone rapid development. Flash memory devices can store data for a considerably long time without powering, and have advantages such as high integration level, fast access, easy erasing, and rewriting. To further improve the bit density and reduce cost of flash memory devices, three-dimensional NAND flash memory devices have been developed.

A three-dimensional NAND flash memory device includes a stack of gate electrodes arranged over a substrate, with a plurality of semiconductor channels through and intersecting word lines, into the substrate. The bottom/lower gate electrodes function as bottom/lower selective gates. The top/upper gate electrodes function as top/upper selective gates. The word lines/gate electrodes between the top/upper selective gate electrodes and the bottom/lower gate electrodes function as word lines. The intersection of a word line and a semiconductor channel forms a memory cell. The top/upper selective gates are connected to word lines for row selection, and the bottom/lower selective gates are connected to bit lines for column selection.

BRIEF SUMMARY

Embodiments of three-dimensional memory device architectures and fabrication methods therefore are disclosed herein. The disclosed structures and methods provide numerous benefits, including, but not limited to simplifying the fabrication process, reducing the size of the three-dimensional memory device, and improving the space utility of the chip which the three-dimensional memory device is formed on.

In some embodiments, a three-dimensional memory device includes: a substrate, the substrate including a device region and a connection region adjacent to one another; a plurality of separate stack structures in the device region and the connection region, the stack structures including a plurality of stacking word lines (e.g., gate electrodes); and separation layers (e.g., gate line slits) over the portions of substrate between adjacent stack structures. The three-dimensional memory device also includes connection structures over the connection region and conductively connecting adjacent stack structures. The connection structure includes a plurality of repeating conductive connection portions, and the two ends of each conductive layer each connects word lines of a same height in adjacent stack structures. The three-dimensional memory device further includes a plurality of contact vias on the top surface of word lines of each height. Each contact via is conductively connected to the contacting word line, other word lines of the same height as the contacting word line, and the conductive connection portion of the same height as the contacting word line.

In some embodiments, the conductive connection portions are made of a same material as the word lines.

In some embodiments, the conductive connection portions and the word lines are made of one or more of tungsten, aluminum, and copper.

In some embodiments, the stack structures further include a first insulating portion between adjacent gate structures; and the connection structures further include a second insulating portion between adjacent conductive connection portions.

In some embodiments, the first insulating portion and the second insulating portion are made of silicon oxide.

In some embodiments, the substrate further includes a channel region adjacent to one or more of the connection region and the device region. The stack structures extend to the portion of the substrate of the channel region. In some embodiments, the three-dimensional memory device further includes a plurality of semiconductor channels over the portion of the substrate of the channel region, the semiconductor channels being through the stack structures.

In some embodiments, the three-dimensional memory device further includes a gate dielectric layer between the word lines and the semiconductor channels.

In some embodiments, a method for forming a three-dimensional memory device includes: providing a substrate, the substrate including a device region and a connection region adjacent to one another; forming a plurality of separate stack structures in the device region and the connection region, the stack structures including a plurality of stacking word lines; and forming separation layers (e.g., gate line slits) over the portions of substrate between adjacent stack structures. The method also includes forming connection structures over the connection region and conductively connecting adjacent stack structures. The connection structure includes a plurality of repeating conductive connection portions, and the two ends of each conductive layer each connects word lines of a same height in adjacent stack structures. The method further includes forming a plurality of contact vias on the top surface of word lines of each height. Each contact via is conductively connected to the contacting word line, other word lines of the same height as the contacting word line, and the conductive connection portion of the same height as the contacting word line.

In some embodiments, the stack structures further include an insulating portion between adjacent gate structures, and the connection structures further include an insulating portion between adjacent conductive connection portions. In some embodiments, the operations to form the stack structures and the insulating portions include: forming a composite structure over the portions of the substrate of the device region and the connection region. The composite structure includes a plurality of insulating portions and a plurality of sacrificial layers alternatingly arranged. The composite structure can be patterned to remove portions of the composite structure in the device region and form vertical trenches, where the vertical trenches extend through the composite structure along a direction perpendicular to the substrate. The direction the vertical trenches extend can be perpendicular to the boundary between the device region and the connection region. Further, separation layers (e.g., gate line slits) can be formed in the vertical trenches. After the separation layers are formed, sacrificial layers in the device region and the connection region can be removed, and a horizontal trench can be formed between adjacent insulating portions. Word line layers can be formed in the horizontal trenches in the device region and the connection region. The portion of the word line layers in the device region and the portion of word line layers in the connection region neighboring the separation layers can form word lines. The word line layers in the connection regions can be connected to form the conductive connection portions.

In some embodiments, patterning the composite structure includes forming a mask layer over the composite structure, the mask layer covering the portion of the composite structure in the connection region and a portion of the composite structure in the device region. The mask layer can be used as an etch mask to etch the composite structure.

In some embodiments, etching the composite structure includes dry etch and/or wet etch.

In some embodiments, before forming the word lines, the method further includes forming a gate dielectric layer at the bottoms and the sidewalls of the portion of horizontal trenches in the device region and the connection region.

In some embodiments, the substrate further includes a channel region adjacent to one or more of the connection region and the device region. The stack structures extend to the portion of the substrate of the channel region. In some embodiments, before removing the sacrificial layers in the device region and the connection region, the method further includes forming a plurality of semiconductor channels over the portion of the substrate of the channel region, the semiconductor channels being through the stack structures In some embodiments, the insulating portions include silicon oxide; the sacrificial layers include poly-silicon, poly-germanium, and/or silicon nitride; and the word line layers include tungsten, aluminum, and/or copper.

In some embodiments, removing the sacrificial layers in the device region and the connection region includes isotropic dry etch and/or wet etch.

In some embodiments, forming the word lines includes chemical vapor deposition (CVD).

In some embodiments, the conductive connection portions include tungsten, aluminum, and/or copper.

Compared to conventional technology, the present disclosure includes the following advantages.

Using the three-dimensional memory device provided by the present disclosure, a conductive connection portion can connect word lines of the same height in adjacent stack structures, electrical connection of word lines of the same height in adjacent stack structures can be obtained. Accordingly, word lines of the same height in adjacent stack structures can share a same contact via so that these word lines can be connected to an external circuit. Thus, the disclosed method can reduce the number of contact vias, simplify fabrication of the three-dimensional memory device, reduce the size of the memory device, and improve the space utilization of the chip.

Using the method for forming a three-dimensional memory device provided by the present disclosure, connection structures can be formed over the portion of the substrate of the connection region. The connection structure can connect adjacent stack structures. Electrical connection of word lines of the same height in adjacent stack structures can be obtained through the stack structures, and word lines of the same height in adjacent stack structures can share a same contact via so that these word lines can be connected to an external circuit. Thus, the disclosed method can reduce the number of contact vias, simplify fabrication of the three-dimensional memory device, reduce the size of the memory device, and improve the space utilization of the chip.

BRIEF DESCRIPTION OF THE DRAWINGS

Aspects of the present disclosure are best understood from the following detailed description when read with the accompanying figures. It is noted that, in accordance with the common practice in the industry, various features are not drawn to scale. In fact, the dimensions of the various features may be arbitrarily increased or reduced for clarity of illustration and discussion.

DETAILED DESCRIPTION

Figure 1:
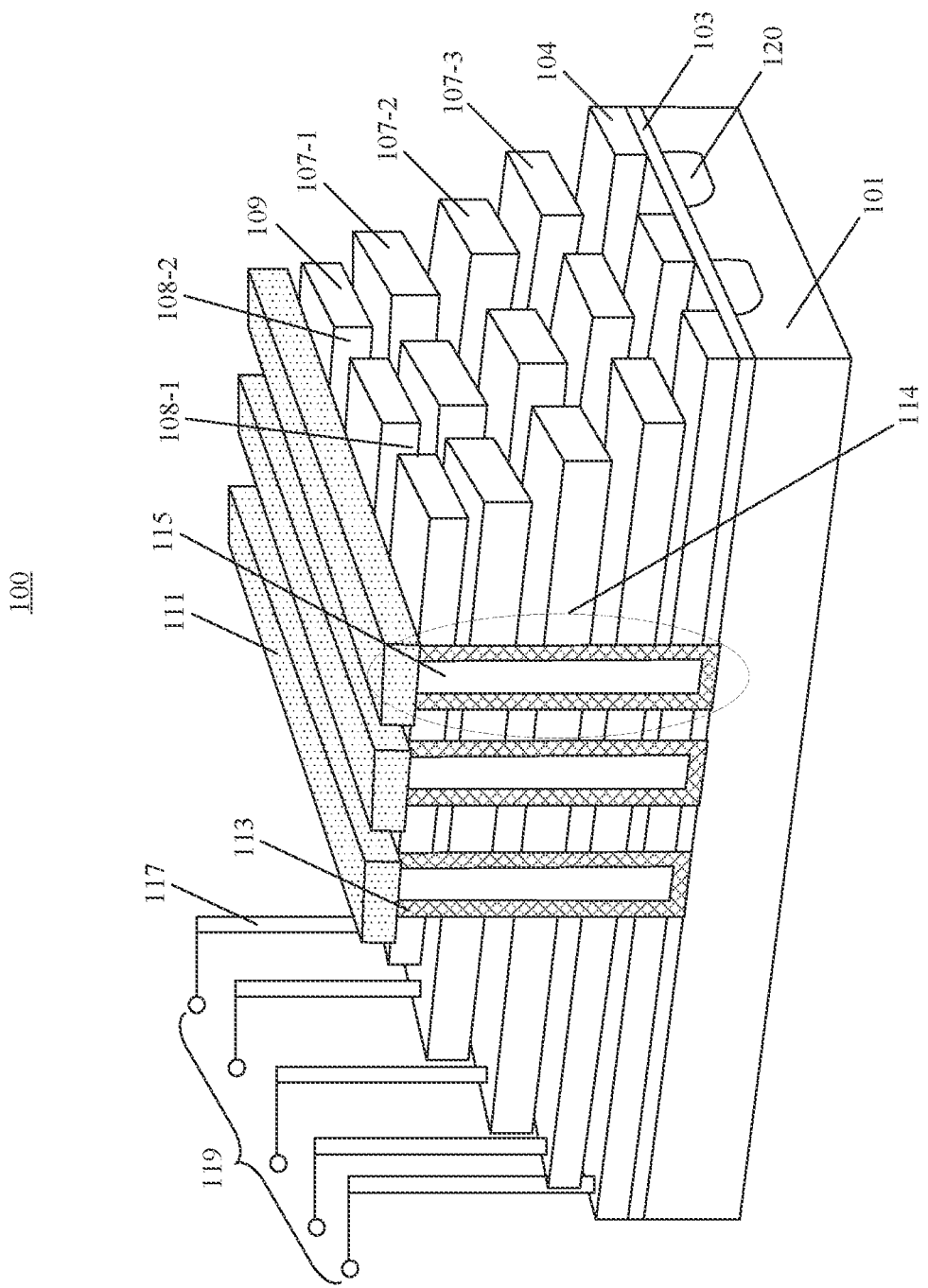
FIG. 1 is an illustration of a three-dimensional memory device.

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure, or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which contacts, interconnect lines, and/or vias are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "3D memory device" refers to a semiconductor device with vertically oriented strings of memory cell transistors (referred to herein as "memory strings," such as NAND strings) on a laterally-oriented substrate so that the memory strings extend in the vertical direction with respect to the substrate. As used herein, the term "vertical/vertically" means nominally perpendicular to the lateral surface of a substrate.

The trend in three-dimensional NAND memory industry includes the reduction of device dimensions and the simplification of fabrication process. In a three-dimensional NAND memory device, memory cells for storing data are embedded in a stack of word lines (control gate electrodes) and the semiconductor channels formed through the stack. Each word line is separately connected to a metal contact via, which is further connected to a metal interconnect, a bit line, and/or an external circuit (e.g., control circuit), so that writing and erasing data in the memory cells can be controlled from the external circuit. Thus, the number of metal contact vias is often equal to the number of word lines. As the demand of storage capacity increases, numerous memory cells, which are formed by an increased number of word lines and semiconductor channels, are formed in a NAND memory device. Accordingly, more metal contact vias need to be formed to connect to the word lines. Meanwhile, the size of a NAND memory device keeps decreasing. It is thus more difficult to form an increased number of metal contact vias (i.e., as well as metal interconnects) in a reduced device space. For example, to arrange an increased number of metal contact vias into a smaller NAND memory device, the fabrication of the word lines and metal contact vias need to adapt to the reduced dimensions of these parts so that a desired number of word lines and metal contact vias can be formed in a smaller NAND memory device. As a result, the fabrication of the smaller NAND memory device becomes more challenging, and the space in the smaller NAND memory device is not efficiently utilized.

In the present disclosure, for ease of description, "tier" is used to refer to elements of substantially the same height along the vertical direction. For example, a word line and the underlying gate dielectric layer can be referred to as "a tier," a sacrificial layer and the underlying insulating layer can together be referred to as "a tier," a word line and the underlying insulating layer can together be referred to as "a tier," word lines of substantially the same height can be referred to as "a tier of word lines" or similar, and so on.

FIG. 1 illustrates a block 100 of a three-dimensional NAND flash memory device. The flash memory device includes a substrate 101, an insulating layer 103 over substrate 101, a tier of lower selective gate electrodes 104 over the insulating layer 103, and a plurality of tiers of control gate electrodes 107 stacking on top of bottom selective gate electrodes 104. The flash memory device also includes a tier of upper selective gate electrodes 109 over the stack of control gate electrodes 107, doped source line regions 120 in portions of substrate 101 between adjacent lower selective gate electrodes 104, and semiconductor channels 114 through upper selective gate electrodes 109, control gate electrodes 107, lower selective gate electrodes 104, and insulating layer 103. Semiconductor channel 114 includes a memory film 113 over the inner surface of semiconductor channel 114 and a core filling film 115 surrounded by memory film 113 in semiconductor channel 114. The flash memory device further includes a plurality of bit lines 111 connected to semiconductor channels 114 over upper selective gate electrodes 109 and a plurality of metal interconnects 119 connected to the gate electrodes through a plurality of metal contacts 117. Insulating layers between adjacent tiers of gate electrodes are not shown in FIG. 1. The gate electrodes include upper selective gate electrodes 109, control gate electrodes 107 (e.g., also referred to as the word lines), and lower selective gate electrodes 104.

In FIG. 1, for illustrative purposes, three tiers of control gate electrodes 107-1, 107-2, and 107-3 are shown together with one tier of upper selective gate electrodes 109 and one tier of lower selective gate electrodes 104. Each tier of gate electrodes have substantially the same height over substrate 101. The gate electrodes of each tier are separated by gate line slits 108-1 and 108-2 through the stack of gate electrodes. Each of the gate electrodes in a same tier is conductively connected to a metal interconnect 119 through a metal contact via 117. That is, the number of metal contacts formed on the gate electrodes equals the number of gate electrodes (i.e., the sum of all upper selective gate electrodes 109, control gate electrodes 107, and lower selective gate electrodes 104). Further, the same number of metal interconnects is formed to connect to each metal contact via. As the dimensions of the flash memory device decrease, it becomes more difficult to form the metal contact vias and metal interconnects that can be fit into the decreased space of the device.

The present disclosure describes a three-dimensional NAND memory device in which one or more word lines of a same tier in a block are conductively connected together and the connected word lines are conductively connected to a shared metal contact via to reduce the number of metal contact vias and metal interconnects. The disclosed method and structure simplify the fabrication process to form the three-dimensional NAND memory device. A benefit, among others, of conductively connecting the word lines of a same tier is largely decreasing the number of metal interconnects connecting to control signals. In other words, in a same tier, connected word lines can share a same metal interconnect. The formed three-dimensional NAND memory device can thus have a reduced number of metal contact vias and metal interconnects, and the total number of metal contact vias is smaller than the total number of word lines. The fabrication of the three-dimensional NAND memory device can thus be simplified, the dimensions of the memory device can be further reduced, and the space in the memory device can be more efficiently utilized.

For illustrative purposes, similar or same parts in a three-dimensional NAND device are labeled using same element numbers. However, element numbers are merely used to distinguish relevant parts in the Detailed Description and do not indicate any similarity or difference in functionalities, compositions, or locations. The structures 200-1000 illustrated in FIG. 2 to FIG. 10 are each part of a three-dimensional NAND memory device. Other parts of the memory device are not shown for ease of description. Although using a three-dimensional NAND device as an example, in various applications and designs, the disclosed structure can also be applied in similar or different semiconductor devices to, e.g., reduce the number of metal connections or wiring. The specific application of the disclosed structure should not be limited by the embodiments of the present disclosure. For illustrative purposes, word lines and gate electrodes are used interchangeably to describe the present disclosure.

Figure 2A:
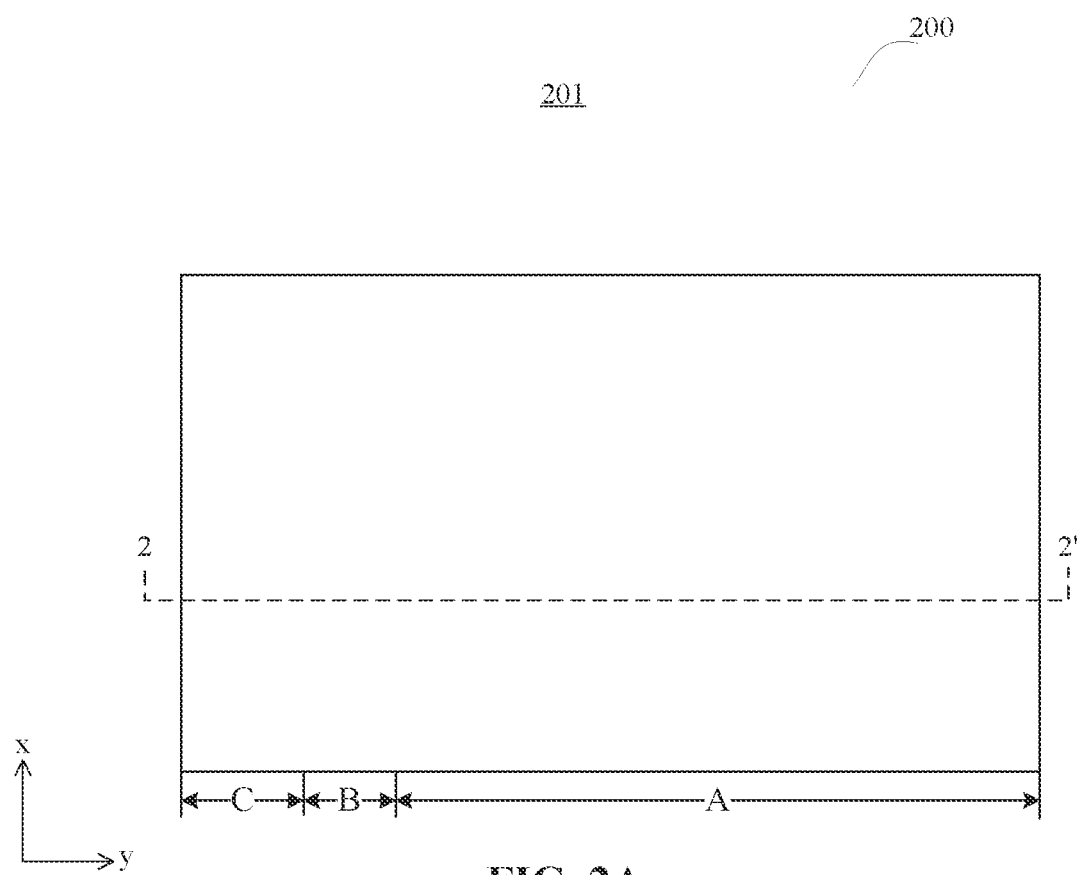
FIGS. 2A, 3A, 4A, 5A, 6A, 7A, 8A, and 9A are each an illustration of a top view of a three-dimensional memory structure at different stages of an exemplary fabrication process, according to some embodiments.
Figure 2B:
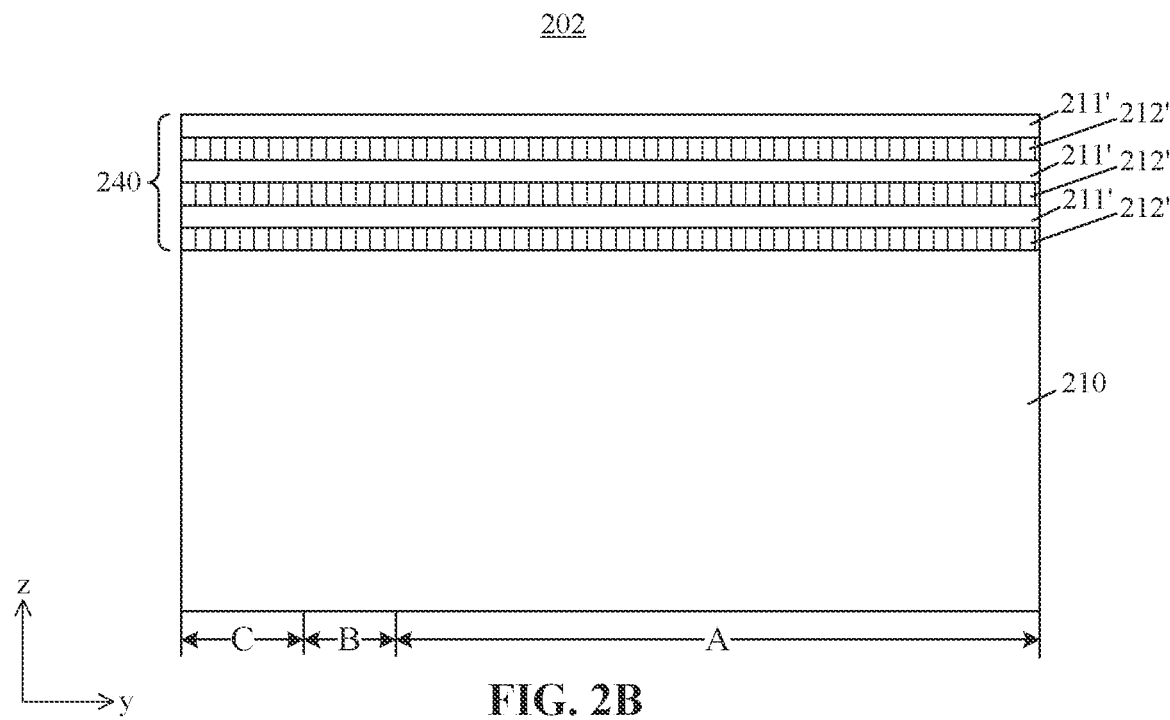
FIG. 2B is an illustration of a cross-sectional view of the three-dimensional memory structure in FIG. 2A, according to some embodiments.

FIGS. 2A and 2B illustrate an exemplary structure 200 for forming a three-dimensional memory structure, according to some embodiments. FIG. 2A is a top view 201 of structure 200, and FIG. 2B is a cross-sectional view 202 of structure 200 along the 2-2' direction. In some embodiments, structure 200 includes a base substrate 210 and a material layer 240 over base substrate 210. Base substrate 210 can provide a platform for forming subsequent structures. Material layer 240 can include an alternating stack (e.g., dielectric layer pairs/stack) having a first material/element 211' and a second material/element 212' arranged alternatingly. Material layer 240 can be used to form subsequent word lines over base substrate 210. For illustrative purposes, three tiers/pairs of first material 211'/second material 212' are shown to describe the present disclosure. In various applications and designs, material layer 240 can include any suitable number of tiers/pairs of first material/second material stacking together, depending on the design of the three-dimensional memory device. For example, material layer 240 can include 64 tiers/pairs of first material/second material stacking together, which subsequently forms 64 tiers of word lines in a three-dimensional memory device.

In some embodiments, base substrate 210 includes any suitable material for forming the three-dimensional memory device. For example, base substrate 210 can include silicon, silicon germanium, silicon carbide, silicon on insulator (SOI), germanium on insulator (GOI), glass, gallium nitride, gallium arsenide, and/or other suitable III-V compounds.

In some embodiments, material layer 240 includes an alternating stack of sacrificial material layers 211' (i.e., first element or first material) and insulating material layers 212' (i.e., second element or second material), arranged vertically (along the z-axis) over base substrate 210. For illustrative purposes, a sacrificial material layer 211' and the corresponding underlying insulating material layer 212' are referred to as a material pair or material pair of the same tier. Sacrificial material layers 211' can each have the same thickness or have different thicknesses. Insulating material layers 212' can each have the same thickness or have different thicknesses. In some embodiments, material layer 240 includes more sacrificial material layers and/or more insulating material layers than the material pairs. The additional sacrificial material layer/layers can each have a thickness same as or different from sacrificial material layers 211' of the material pairs, and the additional insulating material layer/layers can each have a thickness same as or different from insulating material layers 212' of the material pairs. In some embodiments, sacrificial material layers 211' are removed subsequently for depositing gate material for forming word lines. In some embodiments, sacrificial material layers 211' include any suitable material different from insulating material layers 212'. For example, in various embodiments, sacrificial material layers 211' can include poly-crystalline silicon, silicon nitride, poly-crystalline germanium, and/or poly-crystalline germanium-silicon. In some embodiments, sacrificial material layers 211' include silicon nitride. Insulating material layers 212' can include any suitable insulating materials, e.g., silicon oxide. Material layer 240 can be formed by alternatingly depositing insulating material layers 212' and sacrificial material layers 211' over base substrate 210. For example, an insulating material layer 212' can be deposited over base substrate 210, and a sacrificial material layer 211' can be deposited on insulating material layer 212', and so on and so forth. The deposition of sacrificial material layers 211' and insulating material layers 212' can be include any suitable deposition methods such CVD, physical vapor deposition (PVD), plasma-enhanced CVD (PECVD), sputtering, metal-organic chemical vapor deposition (MOCVD), and/or atomic layer deposition (ALD). In some embodiments, sacrificial material layers 211' and insulating material layers 212' are each formed by CVD.

For illustrative purposes, structure 200 (e.g., or base substrate 210) is divided into three regions, i.e., regions A, B, and C. In the subsequent fabrication of the three-dimensional memory structure, word lines (gate electrodes) are formed through regions A (e.g., device region), B (e.g., connection region), and C (e.g., array region) along a horizontal direction (e.g., y-axis) substantially parallel to the top surface of base substrate 210, semiconductor channels (e.g., also known as memory strings) are formed substantially in region C, and connection portions that conductively connect word lines are substantially formed in region B. It should be noted that, regions A, B, and C are presented for ease of description only, and are not intended to indicate physical division of structure 200 or dimensions of structure 200.

Figure 3A:
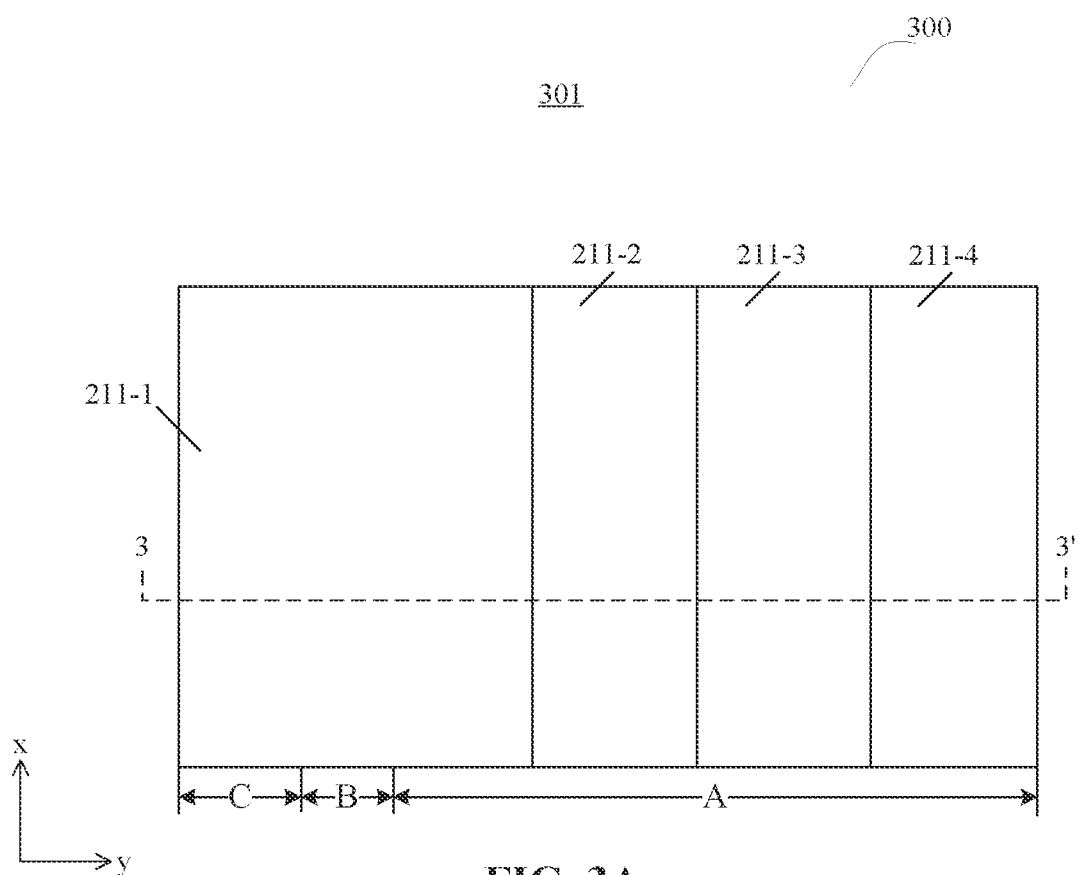
Figure 3B:
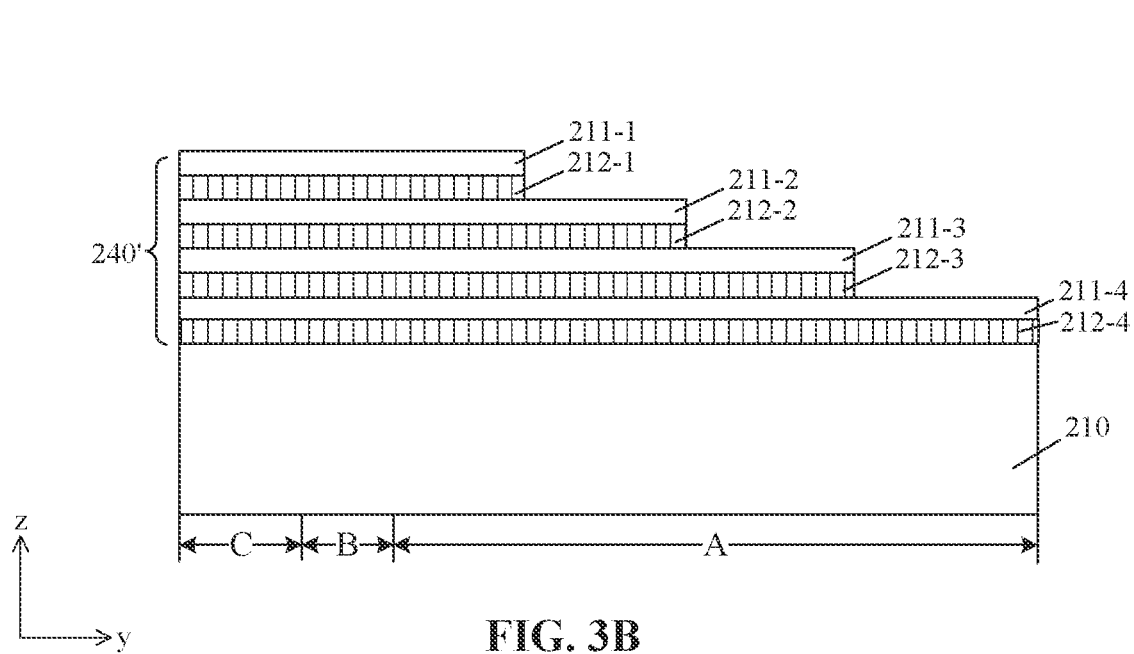
FIG. 3B is an illustration of a cross-sectional view of the three-dimensional memory structure in FIG. 3A, according to some embodiments.

FIGS. 3A and 3B illustrate an exemplary structure 300 for forming the three-dimensional memory device, according to some embodiments. FIG. 3A is a top view 301 of structure 300, and FIG. 3B is a cross-sectional view 302 of structure 300 along 3-3' direction. The structure illustrated by FIGS. 3A and 3B can be referred to as a "staircase structure" or a "stepped cavity structure." The terms "staircase structure," "stepped cavity structure," or similar refer to a structure having stepped surfaces. In the present disclosure, "stepped surfaces" refer to a set of surfaces that include at least two horizontal surfaces (e.g., along x-y plane) and at least two (e.g., first and second) vertical surfaces (e.g., along the z-axis) such that each horizontal surface is adjoined to a first vertical surface that extends upward from a first edge of the horizontal surface, and is adjoined to a second vertical surface that extends downward from a second edge of the horizontal surface. A "step" or "staircase" refers to a vertical shift in the height of a set of adjoined surfaces.

The staircase structure can have various stepped surfaces, referring to FIGS. 3A and 3B, such that the horizontal cross-sectional shape of the staircase structure changes in step as a function of the vertical distance from the top surface of structure 300. In some embodiments, structure 300 is formed from structure 200 by repetitively etching sacrificial material layers 211' and insulating material layers 212' of material layer 240, e.g., along vertical direction (i.e., z-axis), using a mask. For illustrative purposes, the structure formed by etching material layer 240, which is over base substrate 210 is referred to as stack 240'. Accordingly, as shown in FIGS. 3A and 3B, structure 300 can have a plurality of sacrificial layers (e.g., 211-1 to 211-4) and a plurality of insulating layers (e.g., 212-1 to 212-4). Each sacrificial layer 211 can form a pair or a tier with an adjacent and underlying insulating layer with substantially the same length/shape along the y-axis. For example, sacrificial layer 211-1 and insulating layer 212-1 form a first tier, and sacrificial layer 211-2 and insulating layer 212-2 form a second tier, so on and so forth. The etching of the sacrificial layer and the insulating layer in each pair can be performed in one etching process or different etching processes. After the formation of the stepped surfaces, the mask can be removed, e.g., by asking. In some embodiments, multiple photoresist layers and/or multiple etching processes are employed to form the stepped surfaces. As shown in FIG. 3A, in structure 300, the sacrificial layer (i.e., 211-1 to 211-4) of each tier is exposed along the z-axis. In various embodiments, in each pair/tier, insulating layer 212 can also be over sacrificial layer 211. In this case, an additional insulating layer can be disposed between material layer 240 and base substrate 210. The fabrication process to form the word lines can be similar to the fabrication process provided in this disclosure. Subsequently, metal contact vias that conductively connect to the word lines can be formed by penetrating the insulating layers of each tier and forming a contact with the underlying word line. Details of the fabrication process can be referred to in the present disclosure and are omitted herein.

Figure 4A:
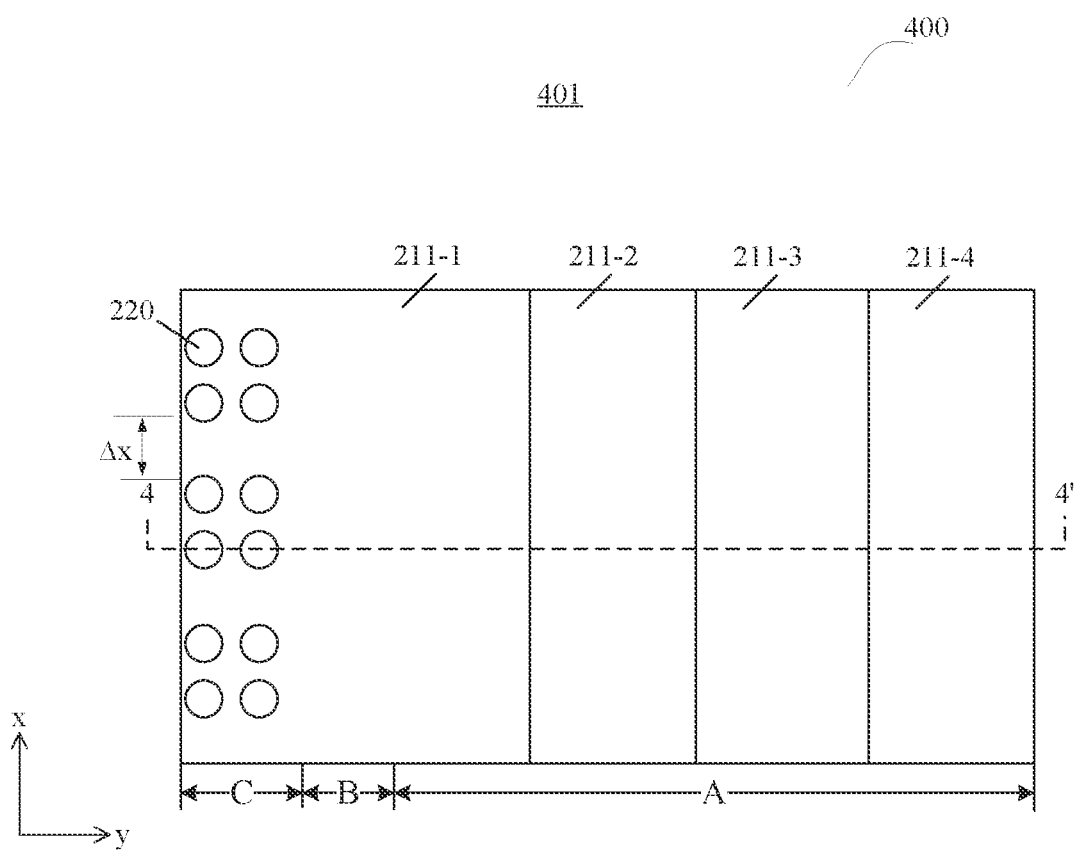
Figure 4B:
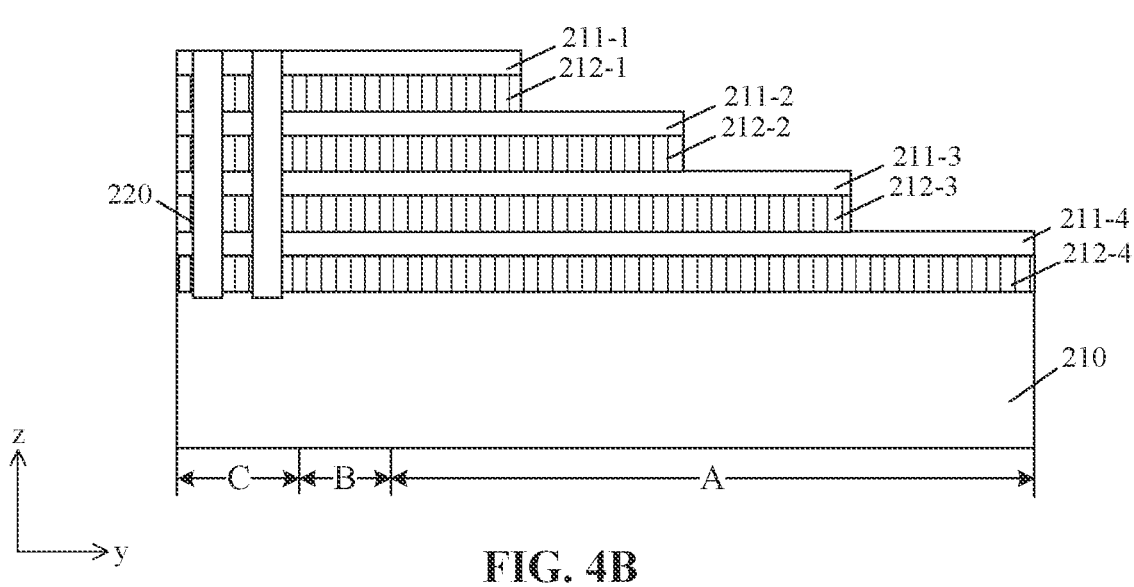
FIG. 4B is an illustration of a cross-sectional view of the three-dimensional memory structure in FIG. 4A, according to some embodiments.

FIGS. 4A and 4B illustrate an exemplary structure 400 for forming the three-dimensional memory device, according to some embodiments. FIG. 4A is a top view 401 of structure 400, and FIG. 4B is a cross-sectional view 402 of structure 400 along the 4-4' direction. In some embodiments, structure 400 includes a plurality of semiconductor channels 220 formed in region C. Semiconductor channels 220 can be distributed as arrays along the x-axis, and each array is separated by a suitable distance of, e.g., Δx, which can be any reasonable distance according to the design/layout of the three-dimensional memory device. Each array of semiconductor channels 220 can have the same number or different numbers of semiconductor channels 220. For illustrative purposes, referring to FIG. 4A, in the present disclosure, each array includes 4 semiconductor channels 220, forming a 2 by 2 array arrangement. Semiconductor channels 220 can be formed through stack 240 substantially along the z-axis and into base substrate 210 for the subsequent formation of source and/or drain of the three-dimensional memory device. Semiconductor channels 220 and subsequently formed word lines can form memory cells, e.g., for storing data, of the three-dimensional memory device.

Each semiconductor channel 220 can substantially have a shape of a pillar along the z-axis and can include a plurality of layers surrounding one another (not shown in the figures of the present disclosure). For example, semiconductor channel 220 can include a dielectric core positioned along the z-axis and substantially in the center of semiconductor channel 220. The dielectric core can be surrounded by a semiconductor channel film. The semiconductor channel film can be surrounded by a memory film. The dielectric core, the semiconductor channel film, and the memory film can each include one or more layers, and can together fill in a channel hole to form semiconductor channel 220. In some embodiments, the channel holes can be formed by patterning stack 240' using a mask, e.g., etching the portions of stack 240' exposed by a patterned mask using a suitable etching process, e.g., dry etch and/or wet etch. The channel holes can be through stack 240 and substantially into base substrate 210. The mask can be removed after the channel holes are formed.

For example, the memory film can be formed over and contacting the sidewall of a channel hole. In some embodiments, the memory film can include one or more block dielectric layers over the sidewall of the channel hole to insulate other layers in the channel hole from stack 240' surrounding the channel hole. The memory film can also include a storage unit layer (memory layer) over and surrounded by the block dielectric layers for trapping charges and forming a plurality of charge storage regions along the z-axis. The memory film can also include a tunneling layer (e.g., tunneling dielectric) over and surrounded by the memory layer. Charge tunneling can be performed through the tunneling layer under a suitable electric bias. In some embodiments, charge tunneling can be performed through hot-carrier injection or by Fowler-Nordheim tunneling induced charge transfer, depending on the operation of the three-dimensional memory device.

The one or more block dielectric layers can include a first block layer which includes a dielectric metal oxide layer with a relatively high dielectric constant. The term "metal oxide" can include a metallic element and non-metallic elements such as oxygen, nitrogen, and other suitable elements. For example, the dielectric metal oxide layer can include aluminum oxide, hafnium oxide, lanthanum oxide, yttrium oxide, tantalum oxide, silicates, nitrogen-doped compounds, alloys, etc. The first block layer can be deposited, for example, by CVD, ALD, pulsed laser deposition (PLD), liquid source misted chemical deposition, and/or other suitable deposition methods.

The one or more block dielectric layers can also include a second block layer which includes another dielectric layer over the dielectric metal oxide. The other dielectric layer can be different from the dielectric metal oxide layer. The other dielectric layer can include silicon oxide, a dielectric metal oxide having a different composition than the first block layer, silicon oxynitride, silicon nitride, and/or other suitable dielectric materials. The second block layer can be deposited, for example, by low pressure chemical vapor deposition (LPCVD), ALD, CVD, and/or other suitable deposition methods. In some embodiments, the one or more block dielectric layers include silicon oxide, which is formed by CVD.

The storage unit layer can be sequentially formed over the one or more block dielectric layers. The storage unit layer can include a charge trapping material, e.g., a dielectric charge trapping material (e.g., silicon nitride) and/or a conductive material (e.g., doped polysilicon). In some embodiments, the dielectric charge trapping material includes silicon nitride and can be formed by CVD, ALD, PVD, and/or other suitable deposition methods.

The tunneling layer can be sequentially formed over the memory layer. The tunneling layer can include silicon oxide, silicon nitride, silicon oxynitride, dielectric metal oxides, dielectric metal oxynitride, dielectric metal silicates, alloys, and/or other suitable materials. The tunneling layer can be formed by CVD, ALD, PVD, and/or other suitable deposition methods. In some embodiments, the tunneling layer includes silicon oxide, which is formed by CVD.

The semiconductor channel film can be sequentially formed over the tunneling layer. The semiconductor channel film can include one or more layers of any suitable semiconductor materials such as silicon, silicon germanium, germanium, III-V compound material, II-VI compound material, organic semiconductor material, and/or other suitable semiconductor materials. The semiconductor channel film can be formed by a suitable deposition method such as metal-organic chemical vapor deposition (MOCVD), LPCVD, CVD, and/or other suitable deposition methods. In some embodiments, the semiconductor channel film is formed by depositing a layer of amorphous silicon using CVD, followed by an annealing process such that the amorphous silicon is converted to single-crystalline silicon. In some embodiments, other amorphous material can be annealed to be crystallized to form the semiconductor channel film.

The dielectric core can be formed over the semiconductor channel film and to fill in the space at the center of the channel hole. The dielectric core can include a suitable dielectric material such as silicon oxide and/or organosilicate glass. The dielectric core can be formed by a suitable conformal deposition method (e.g., LPCVD) and/or self-planarizing deposition method (e.g., spin coating). In some embodiments, the dielectric core includes silicon oxide and is formed by LPCVD.

In various embodiments, the number of layers, the methods to form these layers, and the specific order to form these layers may vary according to different designs and should not be limited by the embodiments of the present disclosure.

Figure 5A:
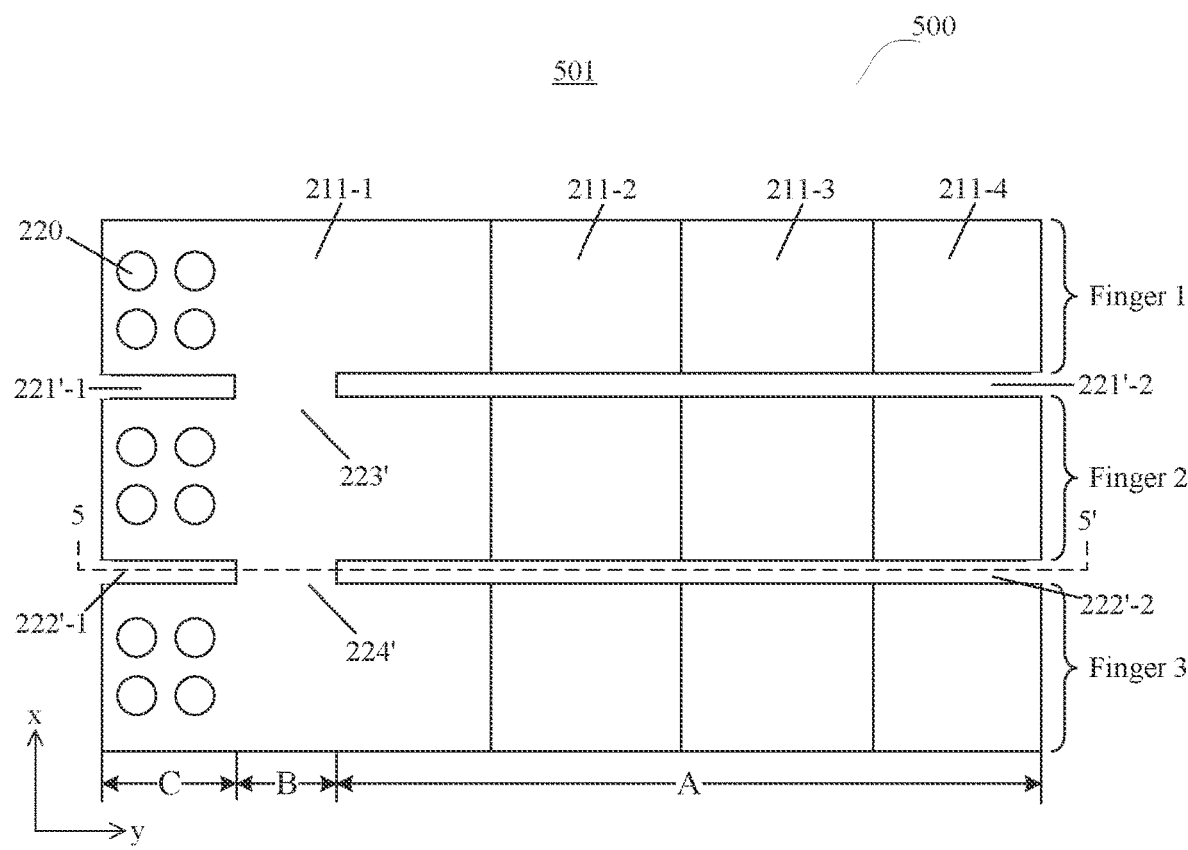
Figure 5B:
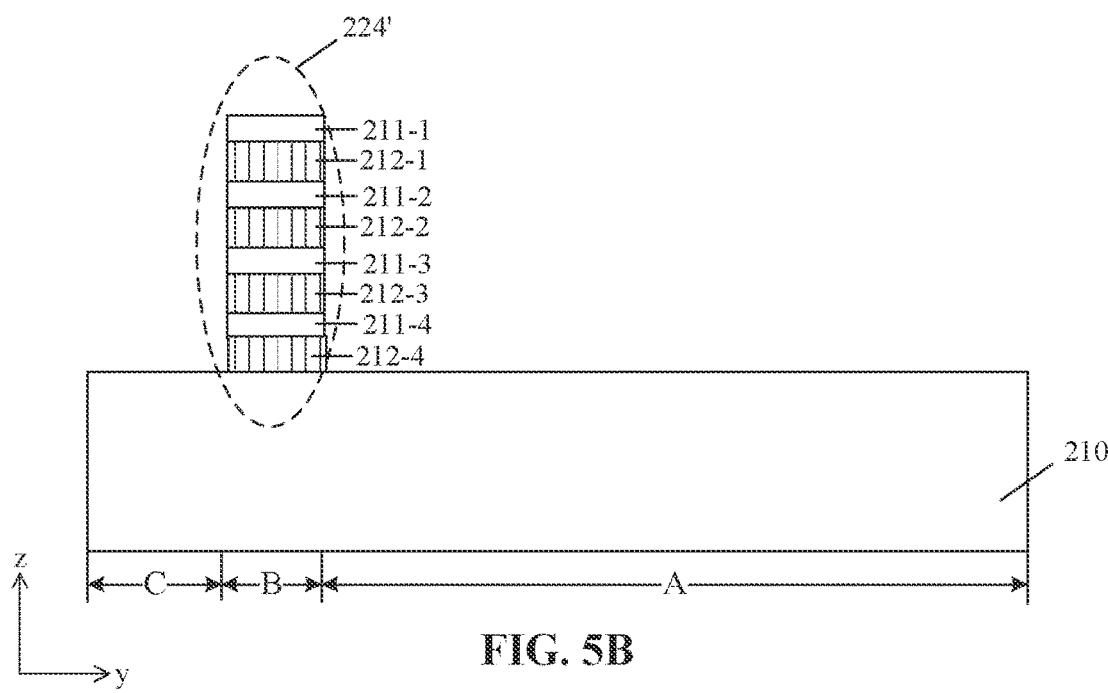
FIG. 5B is an illustration of a cross-sectional view of the three-dimensional memory structure in FIG. 5A, according to some embodiments.

FIGS. 5A and 5B illustrate structure 500 for forming the three-dimensional memory device, according to some embodiments. FIG. 5A is a top view 501 of structure 500, and FIG. 5B is a cross-sectional view 502 of structure 500 along the 5-5' direction. Structure 500 includes a plurality of insulating trenches or vertical trenches, each formed between two arrays of semiconductor channels 220 substantially along the y-axis, to divide stack 240' into a plurality of fingers, each finger extending substantially along the y-axis. In the present disclosure, term "vertical" refers to "along the z-axis" or "substantially perpendicular to the x-y plane." Word lines can be subsequently formed in each finger. A vertical trench can include one or more openings along the y-axis. An opening can vertically form aligned sub-openings in different tiers to allow adjacent fingers of the same tier to be connected through the sub-opening(s) in the tier by material connection portions (i.e., the openings being filled with portions of the material layer 240). The sub-openings formed from the same opening can be aligned with one another along the x-axis, y-axis, and z-axis (i.e., having the same projected area on the top surface of base substrate 210). The vertical trenches can be subsequently filled with a suitable insulating material to form gate line slits, also referred to as insulating spacers. That is, subsequently-formed word lines in adjacent fingers can be insulated at the locations filled with the insulating material and connected at the locations of the openings. In other words, two adjacent word lines of the same tier can be conductively connected through the connection portions formed by the one or more openings (connection portions not filled with the insulating material and filled with the gate metal material).

For illustrative purposes, two adjacent vertical trenches 221' and 222' are shown in FIGS. 5A and 5B. As shown in FIG. 5A, vertical trench 221' includes an opening 223' formed through stack 240' and vertical trench 222' includes an opening 224' formed through stack 240'. Openings 223' and 224' can be formed in region B, and divide vertical trench 221' into first portion 221'-1 and second portion 221'-2 and divide vertical trench 222' into first portion 222'-1 and second portion 222'-2, along the y-axis. The two adjacent vertical trenches 221' and 222' divide structure 500 into fingers 1, 2, and 3, each including an array of semiconductor channels 220. The first portions 221'-1 and 222'-1 of the vertical trenches are formed in region C to divide arrays of semiconductor channels 220 in different fingers along the x-axis, and second portions 221'-2 and 222'-2 are formed in region A to divide subsequently-formed word lines in different fingers. The arrays of semiconductor channels 220 can respectively form memory cells with subsequently-formed word lines in fingers 1, 2, and 3. The sacrificial layer/insulating layer pair of each tier of structure 500 is connected through the openings. For example, FIG. 5B illustrates the cross-sectional view of structure 500 between fingers 2 and 3. For fingers 2 and 3, sacrificial layer 211-1/insulating layer 212-1 pair is connected through opening 224'. Similarly, the sacrificial layer/insulating layer of other tiers (211-2/212-2, 211-3/212-3, and 211-4/212-4) in fingers 2 and 3 are connected through sub-openings of openings 223' and 224' in different tiers. Sacrificial layer/insulating layers in fingers 1 and 2 are connected in a similar configuration. In other words, fingers of stack 240' are connected through region B and separated in regions A and C by vertical trenches 221' and 222'. Accordingly, in subsequent fabrication steps, word lines can be formed in each finger. Adjacent word lines of the same tier can be conductively connected through region B. Also, adjacent insulating layers of the same tier can be connected through the openings 223' and 224' (in region B). In some embodiments, fingers 1, 2, and 3 are together referred to as a block, and word lines of the same tier in the block are connected through region B.

Vertical trenches (e.g., 221' and 222') can be formed by forming a mask layer over stack 240' and patterning the mask using, e.g., photolithography, to form openings corresponding to the vertical trenches in the patterned mask layer. A suitable etching process, e.g., dry etch and/or wet etch, can be performed to remove portions of stack 240' exposed by the openings until the vertical trenches expose base substrate 210. The mask layer can be removed after the formation of vertical trenches. In some embodiments, vertical trenches are through each of the tiers in stack 240' and divide stack 240' into a plurality of fingers along the y-axis. A vertical trench can include one or more openings as described above along the y-axis so that sacrificial layer/insulating layer of adjacent fingers in each tier can be connected through opening(s) of the vertical trench in between. In the present disclosure, the term "vertical" refers to "substantially perpendicular to the x-y plane," or "substantially along the z-axis." In some embodiments, the vertical trenches are substantially perpendicular to the top surface of base substrate 210.

In some embodiments, a vertical trench can have more than one opening to allow adjacent sacrificial layer/insulating layer of a tier in stack 240' to be connected at more than one locations. For example, region B can include a plurality of sub-regions, separated by portions of the vertical trench, along the y-axis. That is, subsequently-formed word lines of adjacent fingers of each tier can be conductively connected at more than one locations. In some embodiments, a vertical trench can have more than one opening to allow sacrificial layer/insulating layer of some of the tiers in stack 240' to be connected at more than one locations. For example, a vertical trench can have one or more openings distributed in region A along the y-axis. That is, subsequently-formed word lines of adjacent fingers of some of the tiers can be conductively connected at more than one locations. Details are described below.

Figure 6A:
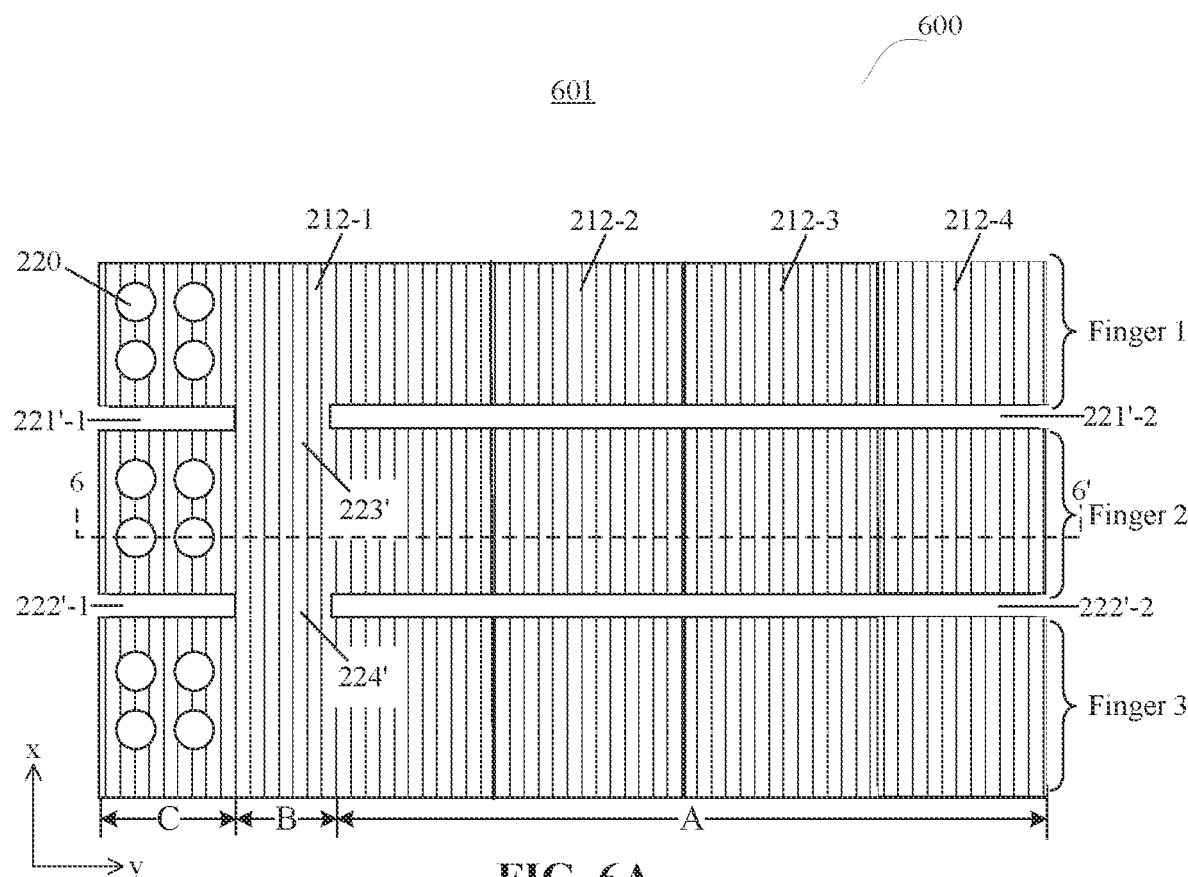
Figure 6B:
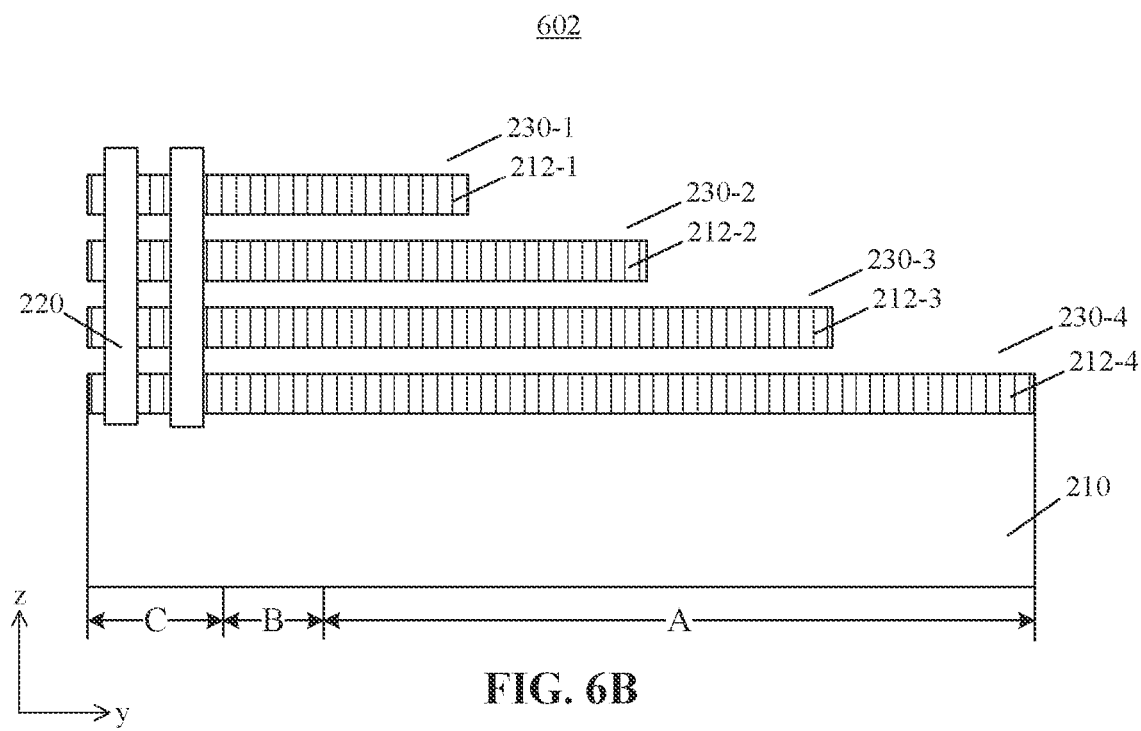
FIG. 6B is an illustration of a cross-sectional view of the three-dimensional memory structure in FIG. 6A, according to some embodiments.

FIGS. 6A and 6B illustrate structure 600 for forming the three-dimensional memory device, according to some embodiments. FIG. 6A is a top view 601 of structure 600, and FIG. 6B is a cross-sectional view 602 of structure 600 along the 6-6' direction. Structure 600 includes a plurality of insulating layers in stack 240'. In some embodiments, structure 600 is formed from structure 500 by removing the sacrificial layers. The insulating layers of each tier can be connected at location(s) not separated by the vertical trenches. Accordingly, horizontal trenches can be formed between the insulating layers of adjacent tiers, i.e., at positions/spaces where the sacrificial layers are removed. A horizontal trench can be divided by the vertical trenches along the z-axis. In the present disclosure, the term "horizontal" refers to "substantially along the x-y plane," or "substantially perpendicular to the z-axis.". Similarly, a horizontal trench of each tier can be connected at location(s) not separated by the vertical trenches. The top surface of the insulating layer of each tier, and the outside sidewall portions of semiconductor channels 220 previously surrounded by the sacrificial layers can be exposed.

For example, as shown in FIGS. 6A and 6B, structure 600 includes vertical trenches 221' and 222', separating fingers 1, 2, and 3 from one another at locations (e.g., in regions A and C) filled with the insulating material. Insulating layer 212 of each tier is connected at location not separated by vertical trenches 221' and 222' (e.g., locations of openings 223' and 224'). After sacrificial layer 211 of each tier is removed, horizontal trenches (e.g., 230-1, 230-2, 230-3, and 230-4) are formed. Accordingly, the top surface of insulating layer of each tier (e.g., 212-1, 212-2, 212-3, and 212-4), and outside sidewall portions of semiconductor channels 220 previously surrounded by sacrificial layers 211 are exposed. Horizontal trench 230 and insulating layer 212 of each tier are respectively connected at region B. In some embodiments, other supporting structures can be formed (e.g., dummy/auxiliary channels in stack 240') to support stack 240' during the removal of sacrificial layers 211. Details of the supporting structures are not described herein.

The sacrificial layers 211 can be removed by a suitable etching process, e.g., an isotropic dry etch or a wet etch. The etching process can have sufficiently high etching selectivity of the material of sacrificial layers 211 over the materials of other parts of substrate 200, such that the etching process can have minimal impact on the other parts of substrate 200. The isotropic dry etch and/or the wet etch can remove sacrificial layers 211 in various directions to expose the top and bottom surfaces of each insulating layer 212, and the outside sidewall portions of semiconductor channels 220 previously surrounded by sacrificial layers 211. Horizontal trenches 230 can then be formed in each tier. In some embodiments, sacrificial layers 211 include silicon nitride and the etchant of the isotropic dry etch includes one or more of $CF_4$, $CHF_3$, $C4F_8$, $C4F_6$, and $CH_2F_2$. The radio frequency (RF) power of the isotropic dry etch can be lower than about 100 W and the bias can be lower than about 10 V. In some embodiments, sacrificial layers 211 include silicon nitride and the etchant of the wet etch includes phosphoric acid.

Figure 7A:
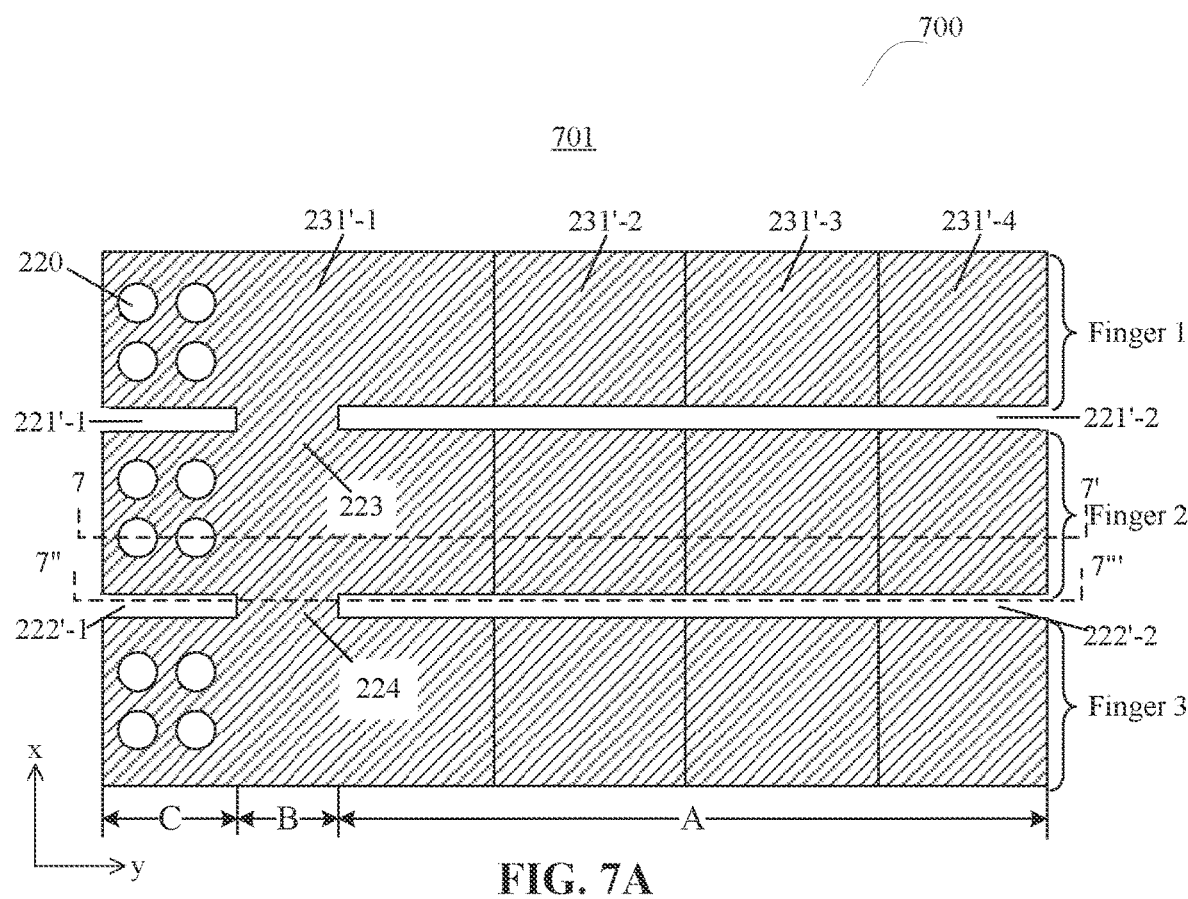
Figure 7B:
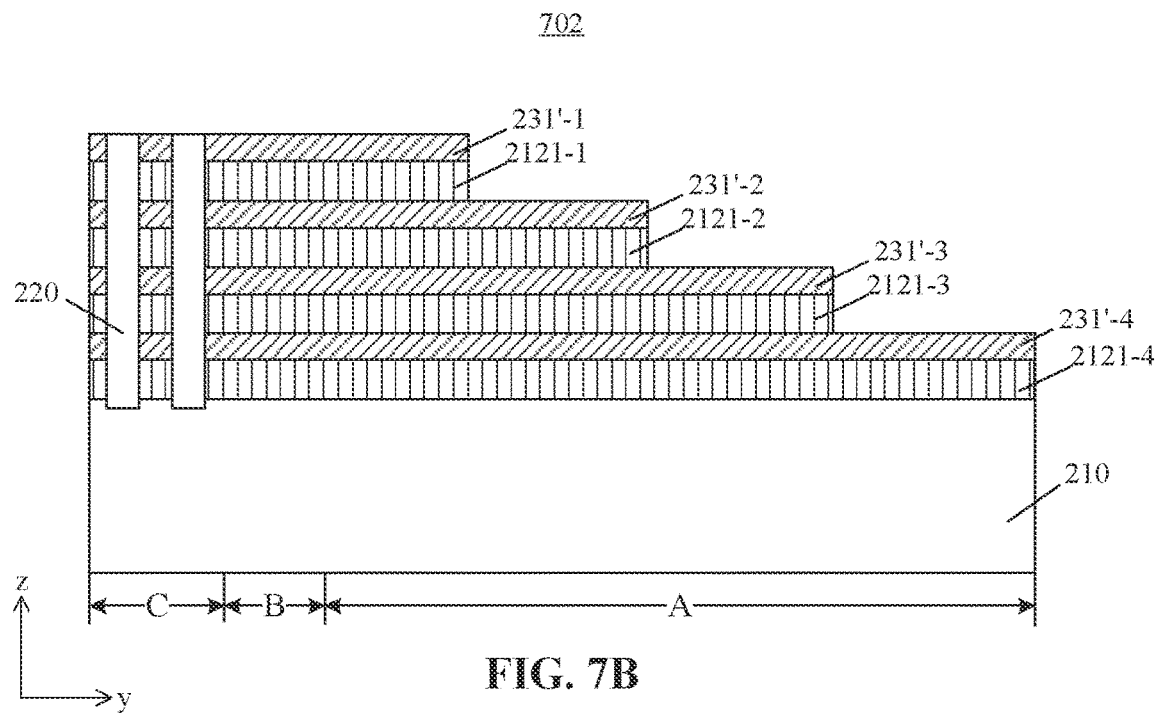
FIG. 7B is an illustration of a cross-sectional view of the three-dimensional memory structure in FIG. 7A, according to some embodiments.
Figure 7C:
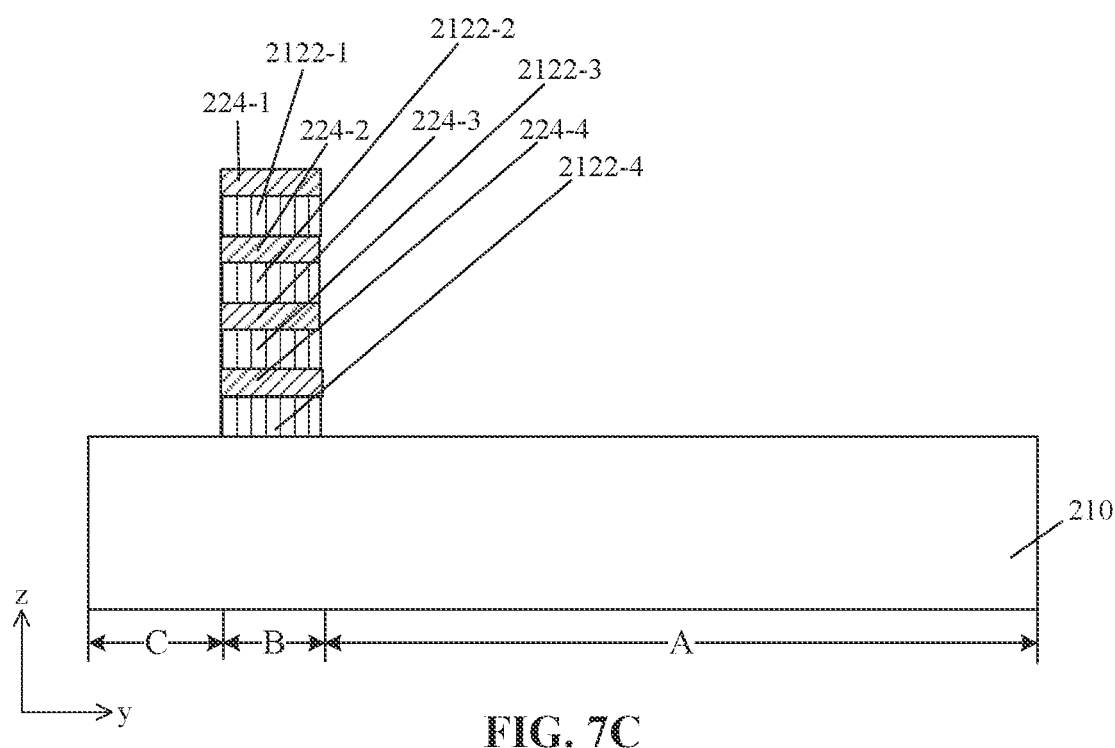
FIG. 7C is an illustration of another cross-sectional view of the three-dimensional memory structure in FIG. 7A, according to some embodiments.

FIGS. 7A, 7B, and 7C illustrate structure 700 for forming the three-dimensional memory device, according to some embodiments. FIG. 7A is a top view 701 of structure 700, FIG. 7B is a cross-sectional view 702 of structure 700 along the 7-7' direction, and FIG. 7C is a cross-sectional view 703 of structure 700 along the 7"-7'" direction. In structure 700, stack 240' includes alternatingly arranged gate material layers 231' and insulating layers 212. For example, each tier of structure 700 includes a gate material layer 231' over the respective insulating layer 212. In some embodiments, structure 700 can be formed from structure 600 illustrated in FIGS. 6A and 6B by filling the horizontal trenches 230 with a suitable gate material (e.g., conductor and/or metal). The gate material can fill each horizontal trench along the x-y plane and cover the respective insulating layer 212. Gate material layers 231' can provide the base material for the subsequently-formed word lines (i.e., gate electrodes). After horizontal trenches 230 are filled with the gate material, connection portions, made of the gate material, can be formed at the opening(s) of the vertical trenches in each tier of stack 240'. A connection portion refers to the portion of gate material layer 231' deposited over the respective insulating layer 212 at an opening formed by a vertical trench.

A connection portion can vertically form a plurality of sub-connection portions from the sub-openings aligned in different tiers. The sub-connection portions formed from one opening can be aligned with one another along the x-axis, y-axis, and z-axis (i.e., having the same projected area on the top surface of base substrate 210). A connection portion can conductively connect different portions of the respective gate material layer 231' that are in the same tier and are connected to the connection portion (i.e., the gate material deposited in the fingers adjacent/connected to the connection portion, or the gate material deposited in adjacent fingers). For the ease of description, the portion of insulating layer 212 under a word line (i.e., in a finger) is referred to as a first insulating portion 2121, and the portion of insulating layer 212 under a connection portion (i.e., between fingers) is referred to as a second insulating portion 2122.

For example, as shown in FIG. 7A, gate material can be deposited into a horizontal trench of each tier (230-1, 230-2, 230-3, and 230-4) of stack 240' to form conductor/dielectric layer pairs/stack. Gate material (e.g., conductor) can fill in the respective horizontal trench 230 to form gate material layer of each tier (231'-1, 231'-2, 231'-3, and 231'-4) of stack 240'. At least a portion of each gate material layer 231' is exposed along the x-y plane. Connection portions 223 and 224 of can be formed by the portion of gate material deposited at the openings 223' and 224'. Accordingly, sub-connection portions of connection portions 223 and 224 of each tier can be formed by the portion of gate material deposited at the openings 223' and 224' of each tier. As shown in FIG. 7B, gate material is formed in finger 2 over the respective first insulating portion (2121-1, 2121-2, 2121-3, and 2121-4), and each first insulating portion 2121 electrically insulates the adjacent gate material on both sides of first insulating portion 2121 along the z-axis. As shown in FIG. 7C, connection portion is formed at the location of opening 224', including sub-connection portions 224-1, 224-2, 224-3, and 224-4 in different tiers aligned along the z-axis (in region B). Each sub-connection portion 224 is formed over the respective second insulating portion 2122, and each second insulating portion 2122 electrically insulates the adjacent sub-connection portion 224 from one another along the z-axis. Sub-connection portion 224 of each tier conductively connects the respective gate material in fingers 1 and 2. For example, sub-connection portion 224-1 conductively connects gate material deposited in fingers 1 and 2 (e.g., the subsequently-formed word lines) of the first tier. Similarly, sub-connection portions 224-2 to 224-4 conductively connect gate material deposited in fingers 1 and 2 of the second to the fourth tiers, respectively. Gate material layer 231' of each tier surrounds the respective outside sidewall portions of semiconductor channels 220.

The gate material can include any suitable conductive material, e.g., tungsten, aluminum, and/or copper, for forming the word lines (i.e., gate electrodes or conductor layers). The gate material can be deposited in horizontal trenches 230 using a suitable deposition method such as CVD, sputtering, MOCVD, and/or ALD. In some embodiments, the gate material includes tungsten, which is formed by CVD.

In some embodiments, a gate dielectric material layer (not shown in the figures of the present disclosure) can be formed in a horizontal trench before the deposition of gate metal material. The gate dielectric material layer can be formed over the opposing surfaces of the adjacent insulating layers that forms the horizontal trench, the outside sidewall portions of semiconductor channels 220 between the opposing surfaces, and respective vertical trench. The gate dielectric material layer provides the base material for the subsequently-formed gate dielectric layer. The gate dielectric layer can insulate the respective word line from the underlying insulating layer 212. The gate insulating material layer can include any suitable dielectric material that is electrically insulating. For example, the gate insulating material layer can include one or more of silicon oxide, silicon nitride, and/or silicon oxynitride. In some embodiments, the gate insulating material layer can include a high-k dielectric material (k less than 3.9). In some embodiments, the gate insulating material layer can include a first silicon oxide layer, a silicon nitride layer over the first silicon oxide layer, and a second silicon oxide layer over the silicon nitride layer. The formation of the gate dielectric material layer can include one or more of CVD, PECVD, PVD, and/or ALD.

A connection portion (e.g., 223 or 224) can conductively connect the gate material deposited in the fingers adjacent/connected to the connection portion. In some embodiments, a vertical trench incudes more than one opening in a tier, so that more than one connection portion is formed from the openings after the deposition of the gate metal material. In some embodiments, each tier includes the more than one sub-connection portions. The more than one sub-connection portions in one tier can enhance/improve the conductive connection between the gate materials deposited in the fingers adjacent/connected to the more than one sub-connection portions such that electrical connection between these fingers can be ensured. Accordingly, subsequently-formed word lines in the connected fingers can share a same metal contact via, which is further connected to a respective metal interconnect for transmitting electrical signals from an external circuit. The number of metal contact vias can thus be reduced and the fabrication of the three-dimensional memory device can be simplified.

Figure 8A:
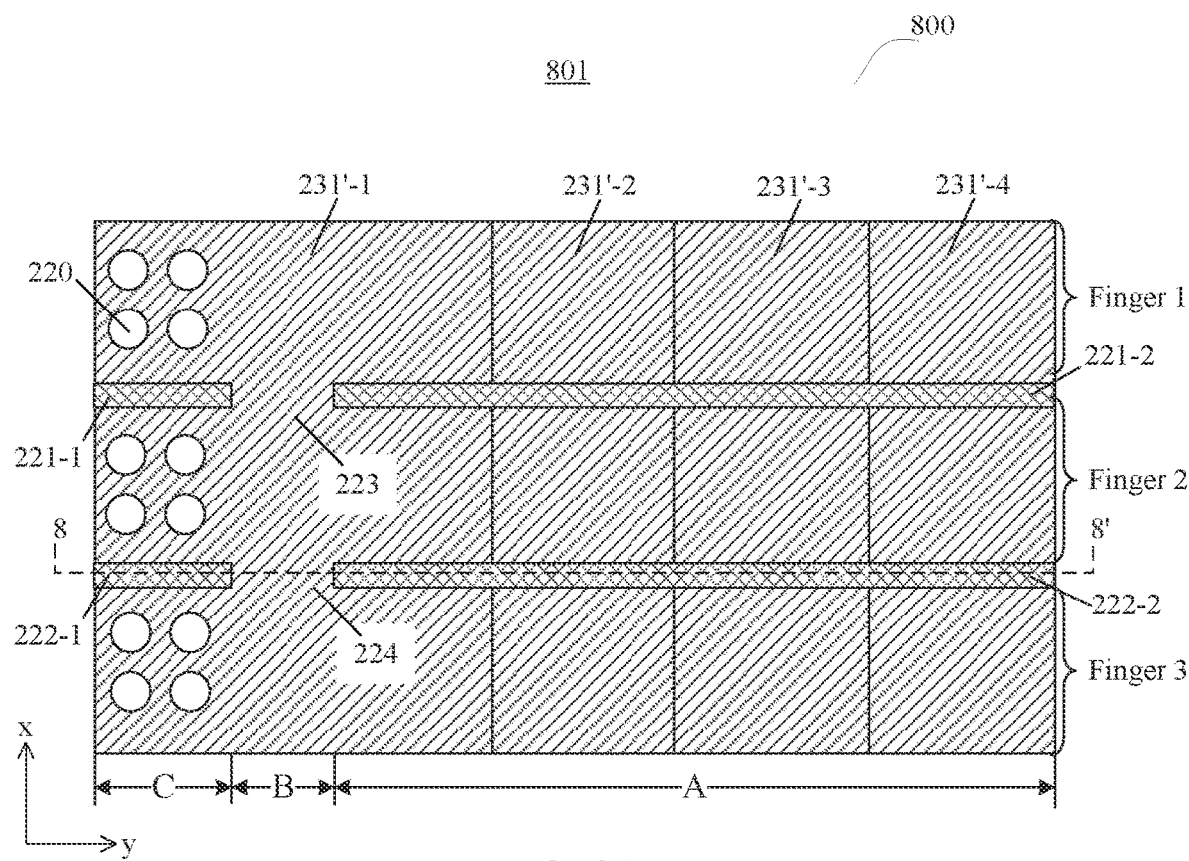
Figure 8B:
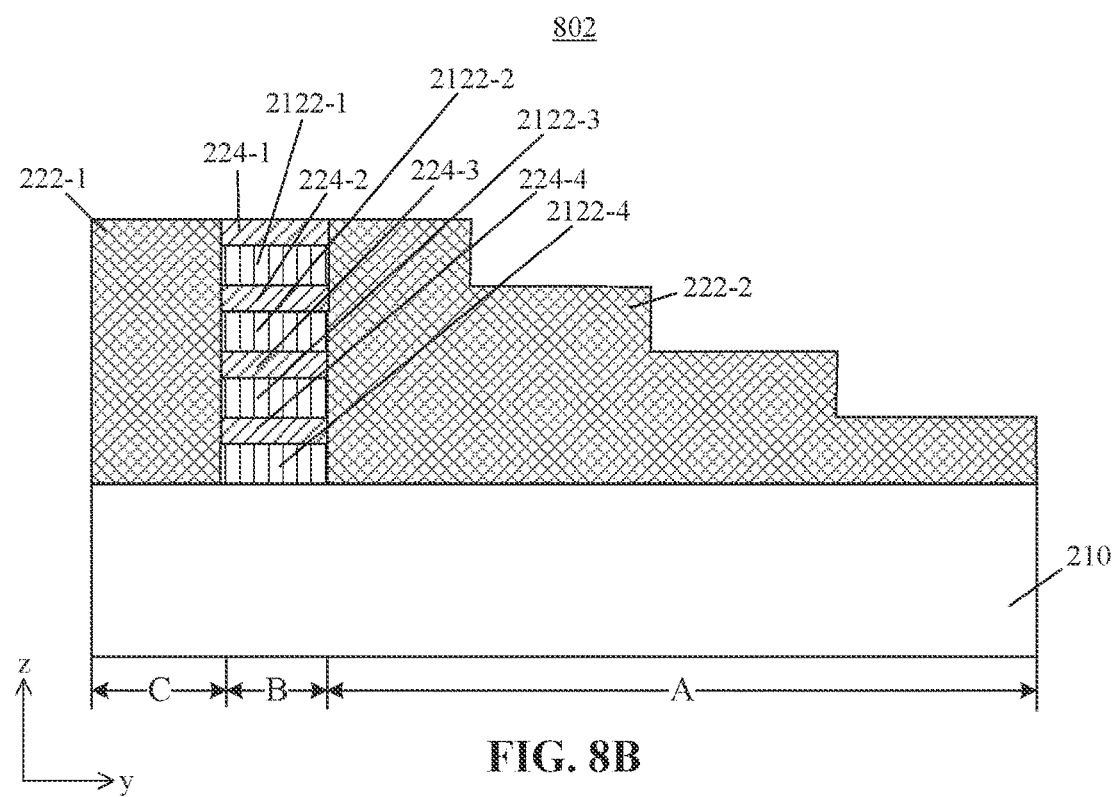
FIG. 8B is an illustration of a cross-sectional view of the three-dimensional memory structure in FIG. 8A, according to some embodiments.

FIGS. 8A and 8B illustrate structure 800 for forming the three-dimensional memory device, according to some embodiments. FIG. 8A is a top view 801 of structure 800, and FIG. 8B is a cross-sectional view 802 of structure 800 along the 8-8' direction. Structure 800 includes a plurality of gate line slits substantially along y-axis. The gate line slits can be formed from filling the vertical trenches described in FIGS. 5A-7C with a suitable insulating material. The formed gate line slits electrically insulate and separate adjacent fingers and subsequently-formed word lines of different tiers at locations filled with the insulating material. A gate line slit can include one or more openings along the y-axis that connect gate material layer/insulating layer of adjacent fingers.

For illustrative purposes, two gate line slits 221 and 222, formed from vertical trenches 221' and 222,' are shown in FIG. 8A. Gate line slit 221 includes connection portion 223 that divides gate line slit 221 to first portion 221-1 and second portion 221-2, and gate line slit 222 includes connection portion 224 that divides gate line slit 222 to first portion 222-1 and second portion 222-2. Gate line slits 221 and 222 divide stack 240' into fingers 1, 2, and 3. Each of gate line slits 221 and 222 insulates adjacent gate material layer/insulating layer of each tier at locations filled with the insulating material (e.g., in regions A and C). Adjacent gate material layer/insulating layer of each tier at locations not filled with the insulating material (e.g., region B) are connected. For example, as shown in FIG. 8B, first portion 222-1 and second portion 222-2 of gate line slit 222 insulate finger 2 from finger 3 in regions A and C through stack 240', and gate material layer/insulating layer pairs of fingers 2 and 3 of the same tier (e.g., 231'-1/2121-1, 231'-2/2121-2, 231'-3/2121-3, and 231'-4/2121-4) are connected in region B.

In some embodiments, gate line slits (e.g., 221 and 222) can be formed by filling vertical trenches (e.g., 221' and 222') with a suitable insulating material. For example, a suitable deposition method, such as CVD, PVD, PECVD, and/or ALD, can be utilized to deposit the insulating material into the vertical trenches. The insulating material can include any suitable material that provides electric insulation between fingers. For example, the insulating material can include silicon oxide, silicon nitride, and/or silicon oxynitride. In some embodiments, the insulating material includes silicon oxide. In some embodiments, a recess etch and/or a chemical-mechanical planarization (CMP) are used to remove excessive insulating material over stack 240' after the deposition such that gate material layer 231'-1 is exposed and the top surfaces of gate line slits level with the top surface of gate material layer 231'-1.

In some embodiments, a doping process is performed before the formation of the gate line slit to dope base substrate 210 at the bottom of a vertical trench (221' and 222') with dopant types opposite of base substrate 210. The doped region at the bottom of a vertical trench can form a source region. The insulating material can then be deposited at the bottom and over the sidewall of the vertical trench. Subsequently, a source contact via can be formed in the vertical trench by filling the center of the vertical trench with a source material. Thus, the insulating material can provide electrical insulation between the source contact via and the rest of stack 240'. In some embodiments, the annular bottom surface of the gate line slit contacts the source region and the source contact via is electrically connected with the source region. In some embodiments, ion implantation is utilized to dope base substrate 210 at the bottom of a vertical trench to form the source region, and the insulating material can be deposited to cover the sidewall of the vertical trench such that a cavity is formed in the vertical trench, surrounded by the insulating material. A suitable source metal can be deposited to fill in the cavity and form the source contact via. The insulating material can include silicon oxide, silicon nitride, and/or silicon oxynitride. The source metal can include tungsten and/or other suitable conductive materials. In some embodiments, a barrier layer, e.g., TiN, is formed between the gate line slit and the source contact via to prevent the source metal from penetrating into stack 240'.

Figure 9A:
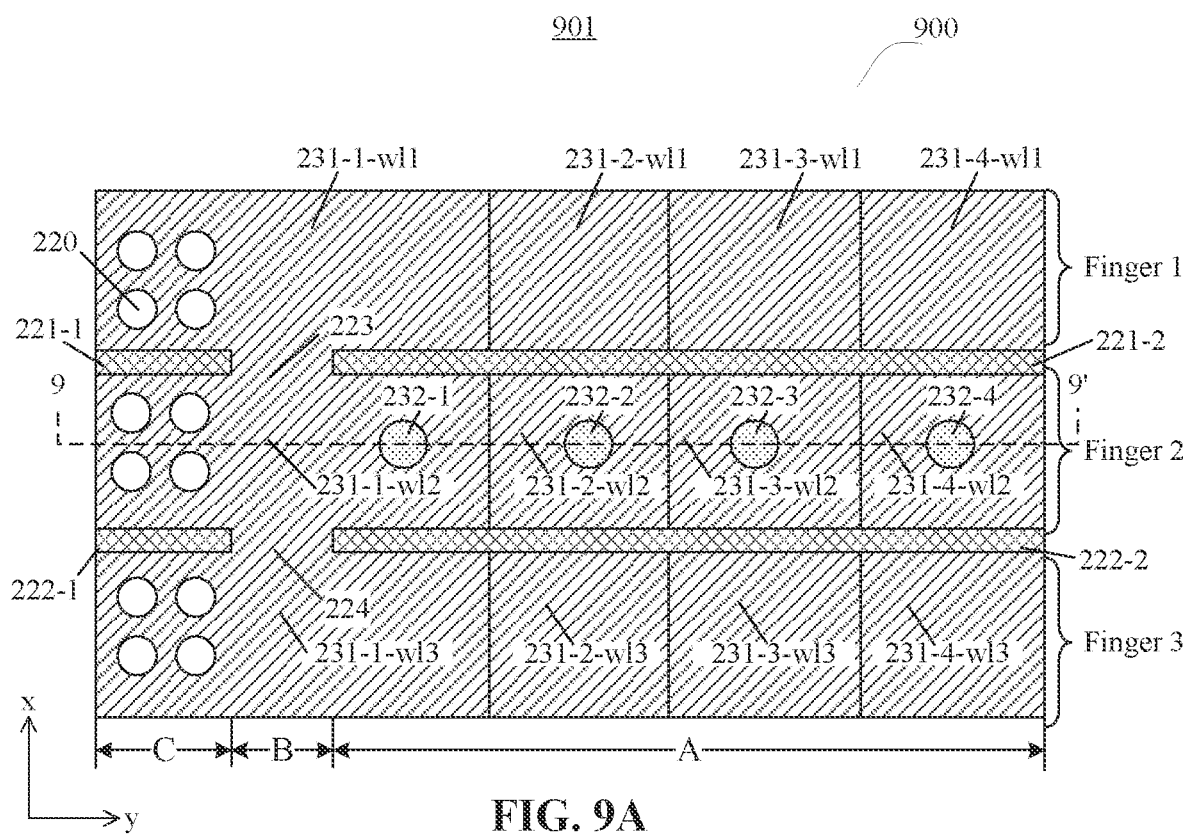
Figure 9B:
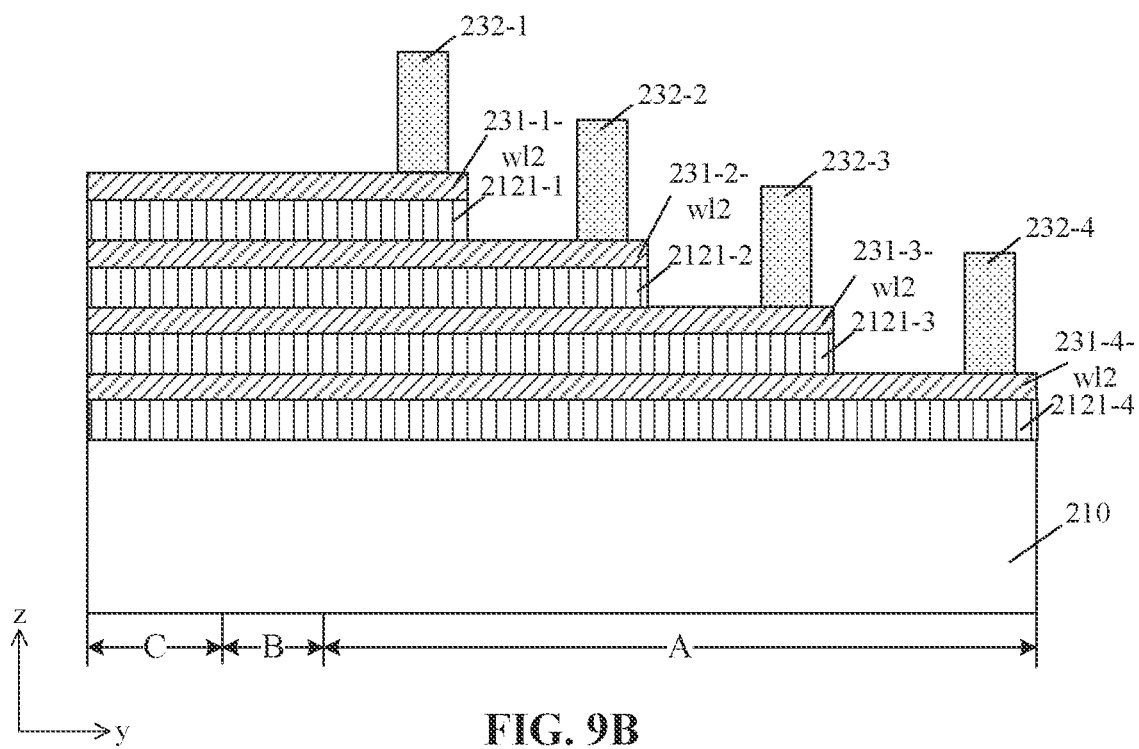
FIG. 9B is an illustration of a cross-sectional view of the three-dimensional memory structure in FIG. 9A, according to some embodiments.

FIGS. 9A and 9B illustrate structure 900 for forming the three-dimensional memory device, according to some embodiments. FIG. 9A is a top view 901 of structure 900, and FIG. 9B is a cross-sectional view 902 of structure 900 along the 9-9' direction. Structure 900 includes a plurality of tiers of word lines stacking along the z-axis and each tier includes a plurality of word lines, each word line being aligned in a different finger. An insulating layer is formed between word lines of adjacent tiers to electrically insulate word lines of the two adjacent tiers. One or more word lines of the same tier can be conductively connected through one or more connection portions. The connected word lines can share a same metal contact via. One or more metal contact vias can be formed on each tier for electrically connecting the connected word lines.

In some embodiments, structure 900 can be formed from structure 800 illustrated in FIGS. 8A and 8B. In some embodiments, excessive gate material and gate dielectric material on the sidewall of stack 240' (e.g., sidewalls of insulating layers 212) can be removed using suitable etching processes (e.g., dry etch and/or wet etch). The remaining portions of the gate material layers can form word lines of each tier, and the remaining portions of the gate dielectric material layers can form the gate dielectric layer of each tier.

In some embodiments, each word line is formed over a respective gate dielectric layer. Further, metal contact vias can be formed over each tier to connect word lines of each tier to the external circuit. In some embodiments, structure 900 includes a dielectric stack (not shown) over/surrounding stack 240' to electrically insulate the subsequently-formed metal contact vias from one another. In some embodiments, the metal contact vias are formed by patterning the dielectric stack to form a plurality of contact openings exposing the contact areas on each tier, and filling the contact openings with a suitable conductive material to form the metal contact vias. The patterning process can include forming a mask over the dielectric stack, performing a photolithography process to define the contact openings in the mask, and removing the material in the contact openings until contact areas of stack 240' are exposed. The contact areas of each tier can be on one or more word lines. Further, the contact openings can be filled with a suitable conductive material, e.g., tungsten, aluminum, and/or copper.

As shown in FIGS. 9A and 9B, after excessive gate material and gate dielectric material are removed from stack 240', the remaining gate material in each tier of stack 240' form word lines (231-$m$-wln, m=1-4, n=1-4) in different fingers substantially along the y-axis. In some embodiments, each finger (e.g., fingers 1-3) includes a plurality of word lines 231-$m$-wln stacking along the z-axis, each word line 231-$m$-wln being insulated from one another along the z-axis by the adjacent first insulating portion(s). Gate line slits 221 and 222 provide electrical insulation between adjacent fingers in regions A and C to separate word lines 231-$m$-wln of different fingers and to separate arrays of semiconductor channels 220 of different fingers, respectively. Adjacent word lines 231-$m$-wln (or word lines 231-$m$-wln of adjacent fingers) of the same tier are conductively connected by sub-connection portions (e.g., 223-1 to 223-4 and/or 224-1 to 224-4, referring to FIGS. 7C and 9A) of the same tier. That is, two or more word lines 231-$m$-wln of the same tier can be conductively connected by one or more sub-connection portions of the same tier so that the connected word lines 231-$m$-wln can share a same metal contact via. In some embodiments, each word line 231-$m$-wln is connected with the other word lines 231-$m$-wln of the same tier through connection portions such that word lines 231-$m$-wln of the same tier can share one metal contact via.

For example, structure 900 includes fingers 1, 2, and 3. Word lines 231-1-wl1, 231-2-wl1, 231-3-wl1, and 231-4-wl1 stack along the z-axis in finger 1; word lines 231-1-wl2, 231-2-wl2, 231-3-wl2, and 231-4-wl2 stack along the z-axis in finger 2; and word lines 231-1-wl3, 231-2-wl3, 231-3-wl3, and 231-4-wl3 stack along z-axis in finger 3. Word lines 231-1-wl1, 231-1-wl2, and 231-1-wl3 are in same tier 1 and are conductively connected by connection portions 223 and 224 (e.g., or the sub-connection portions of connection portions 223 and 224). Metal contact via 232-1 is formed over word line 231-1-wl2 to connect word lines 231-1-wl1, 231-1-wl2, and 231-1-wl3. Similarly, word lines 231-2-wl1, 231-2-wl2, and 231-2-wl3 are in same tier 2 and are conductively connected by connection portions 223 and 224; word lines 231-3-wl1, 231-3-wl2, and 231-3-wl3 are in same tier 3 and are conductively connected by connection portions 223 and 224; and word lines 231-4-wl1, 231-4-wl2, and 231-4-wl3 are in same tier 4 and are conductively connected by connection portions 223 and 224. Metal contact vias 232-2, 232-3, and 232-4, are respectively formed over tiers 2-4 to conductively connect to the word lines of each of the tiers. In some embodiments, two adjacent word lines 231-$m$-wln are conductively connected by more than one connection portions. In some embodiments, some word lines 231-*m*-wln of the same tier are conductively connected and the connected word lines share one or more metal contact vias 232. In some embodiments, more than one metal contact via 232 is formed to connect to the connected word lines 231-*m*-wln to ensure/enhance electrical connection between the connected word lines 231-*m*-wln and the corresponding metal interconnect(s). Depending on the designs, metal contact vias 232 can be formed at any suitable location(s) (in the x-y plane) of a tier. In some embodiments, other structures, e.g., drain region, can be formed in structure 900. For the ease of description, details of formation of the other structures are omitted in the present disclosure.

By using the disclosed method and structure illustrated in FIGS. 2-9, the number of metal contact vias in a three-dimensional memory device can be greatly reduced. In some embodiments, each word line of the same tier can be conductively connected to other word lines by more than one connection portions such that electrical connection can be improved during operation and the memory device is less susceptible to connection failure of these connection portions. In some embodiments, one metal contact via is formed to connect each tier of a block of word lines, of which all the word lines are conductively connected. Assuming each tier includes N word lines, only 1 metal contact vias needs to be formed on this tier. Compared to conventional method and structure, the number of metal contact vias is reduced by (N-1) for each tier of word lines. In some embodiments, from fabrication consideration, connection portions of different tiers are aligned along z-axis, as shown in FIG. 7C. In various embodiments, some of the connection portions in different tiers are misaligned along the z-axis. That is, the specific locations of the connection portions in each tier can be determined separately, according to different design requirements. In some embodiments, other components of the three-dimensional memory device can be adjusted to apply an electrical signal on the desired word line, in operation. For example, the external circuit can be programmed or adjusted to select the desired word line and apply an electrical signal/bias on the word line. Other suitable means can also be applied.

Figure 10:
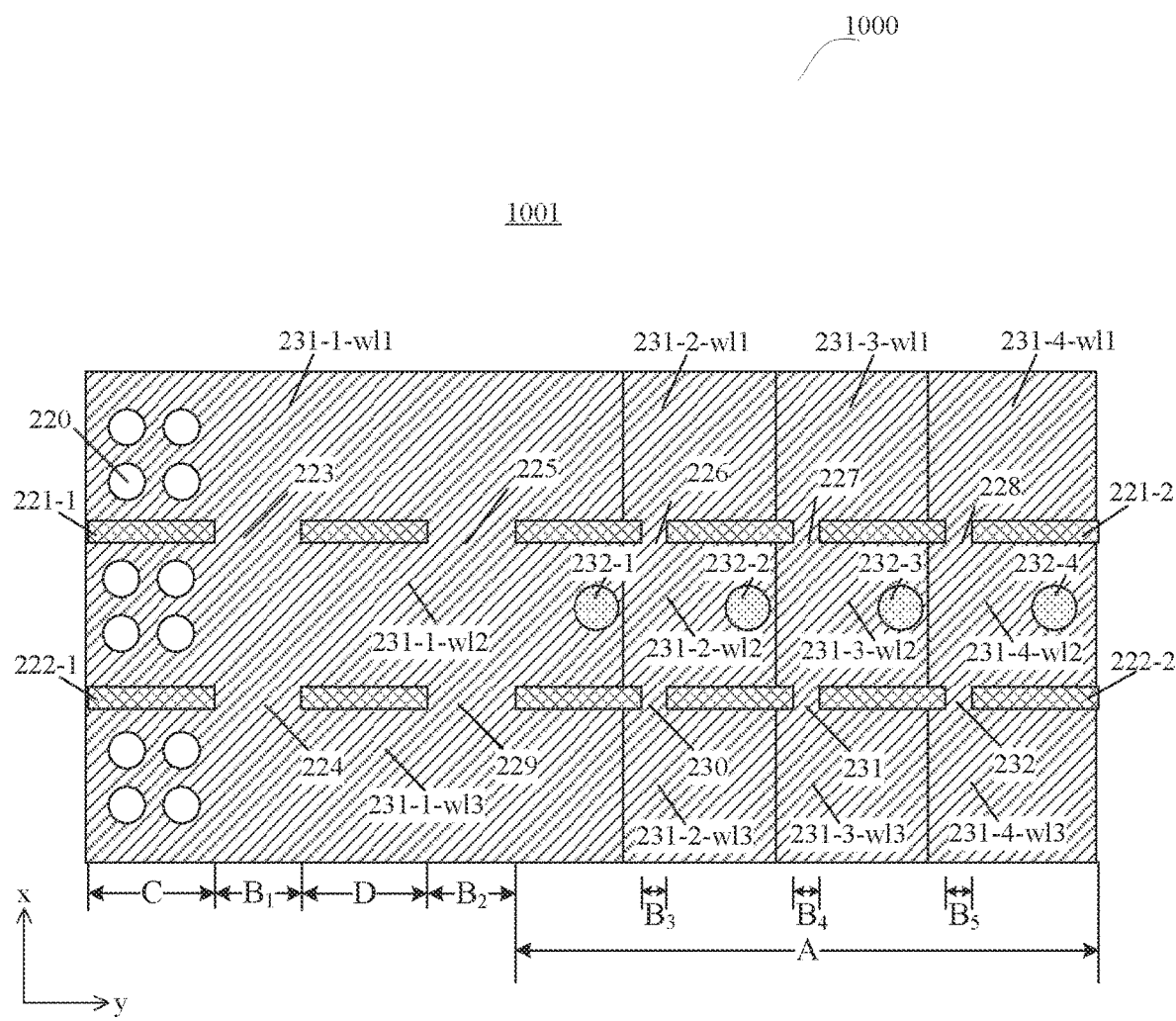
FIG. 10 is an illustration of a top view of another three-dimensional memory structure, according to some embodiments.

FIG. 10 illustrates the top view 1001 of another exemplary structure 1000 of the three-dimensional memory device. Different from structure 900, structure 1000 includes more than one connection portions in each tier to conductively connect the word lines of each tier with the shared metal contact via(s). For illustrative purposes, one metal contact via for each tier (232-1, 232-2, 232-3, and 232-4) are shown. Each of the gate line slits 221 and 222 includes more than one opening substantially along the y-axis so that more than one connection portion (e.g., in regions B1, B2, B3, B4, and B5) is formed substantially along the y-axis. Because a stack of connection portions is formed vertically (along the z-axis) at the location of an opening of a gate line slit, in FIG. 10, word lines of the first tier (i.e., 231-1-wln (n=1-3)) are conductively connected by four connection portions 223, 224, 225, and 229; word lines of the second tier (i.e., 231-2-wln (n=1-3)) are conductively connected by six connection portions 223, 224, 225, 229, 226, and 230; word lines of the third tier (i.e., 231-3-wln (n=1-3)) are conductively connected by eight connection portions 223, 224, 225, 229, 226, 230, 227, and 231; and word line of the fourth tier (i.e., 231-4-wln (n=1-3)) are conductively connected by ten connection portions 223, 224, 225, 229, 226, 230, 227, 231, 228, and 232. An increased number of connection portions in a tier of word lines can more effectively connect desired word lines and reduce the probability of connection failure between word lines. In various embodiments, the total number of metal contact vias is smaller than the total number of word lines. Thus, the number of metal contact vias can be reduced and the fabrication of the three-dimensional memory device can be simplified. Space in the three-dimensional memory device can be more efficiently utilized.

For ease of description, connection portions formed between different fingers align substantially along the x-axis. In various other embodiments, connection portions formed between different fingers can also be staggered or misaligned along the x-axis. For example, in FIG. 10, connection portions 223 and 224 may or may not align with one another along the x-axis. In various designs and applications, the number and the location of connection portions can vary according to different design rules and should not be limited by the embodiments of the present disclosure.

Figure 11:
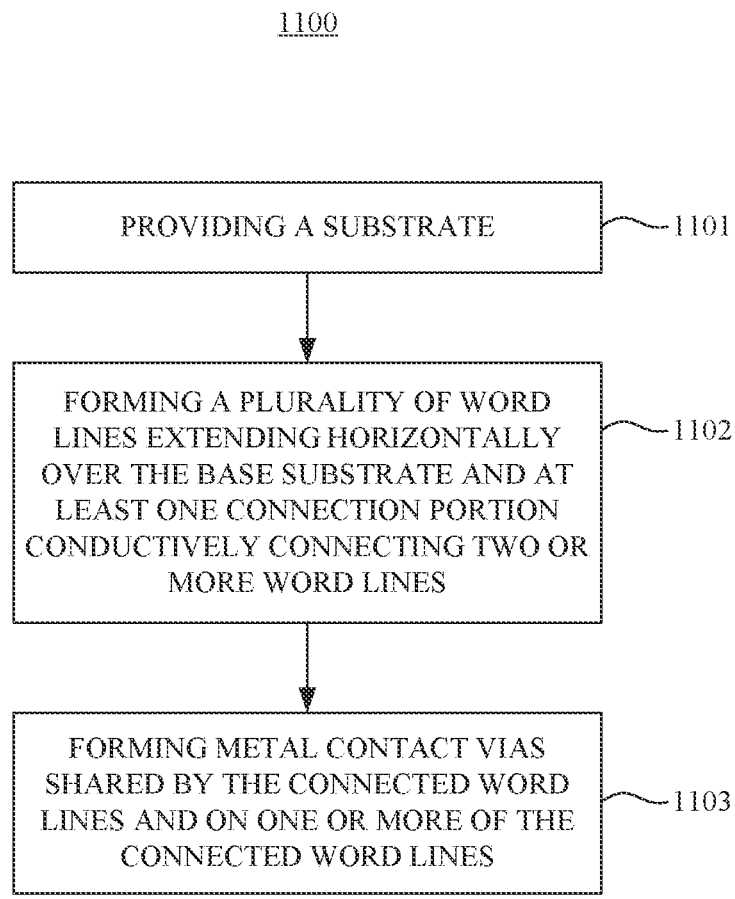
FIG. 11 is an illustration of a fabrication process for forming a three-dimensional memory structure, according to some embodiments.

FIG. 11 is an illustration of an exemplary method 1100 for forming three-dimensional memory device, according to some embodiments. For explanation purposes, the operations shown in method 1100 are described in the context of FIGS. 2-9. In various embodiments of the present disclosure, the operations of method 1100 can be performed in a different order and/or vary.

In operation 1101, a substrate can be provided. FIGS. 2A and 2B illustrate an exemplary substrate in this operation. The substrate can include a base substrate and a material layer over the substrate. The base substrate can include any suitable material for forming the three-dimensional memory structure. For example, the base substrate can include silicon, silicon germanium, silicon carbide, silicon on insulator (SOI), germanium on insulator (GOI), glass, gallium nitride, gallium arsenide, and/or other suitable compound. In some embodiments, the material layer can include an alternating stack of sacrificial material layers and insulating material layers, arranged along a vertical direction over base substrate. In some embodiments, the sacrificial material layers include silicon nitride and the insulating material layers include silicon oxide.

In operation 1102, a plurality of word lines extending horizontally over the base substrate and at least one connection portion conductively connecting two or more word lines can be formed. FIGS. 3A, 3B, 4A, 4B, 5A, 5B, 6A, 6B, 7A-7C, 8A, 8B, 9A, and 9B illustrate exemplary structures in this operation. Referring to FIGS. 3A and 3B, an alternating stack, having a staircase structure, can be formed from the substrate provided in operation 1101. A plurality of alternatingly stacked sacrificial layer/insulating layer pairs can be formed in the stack. A portion of the top surface of each sacrificial layer can be exposed and the respective insulating layer can be under the sacrificial layer. Further, as shown in FIGS. 4A and 4B, a plurality of semiconductor channels can be formed through the stack and substantially into the base substrate. The semiconductor channels can each include at least a dielectric core, a semiconductor channel film, and a memory film. The semiconductor channels can be formed by sequentially depositing the memory film, the semiconductor channel film, and the dielectric core using suitable deposition methods.

Further, referring to FIGS. 5A, 5B, 6A, and 6B, vertical trenches through the stack can be formed along the horizontal direction to divide the stack into a plurality of fingers. The vertical trenches can subsequently form gate line slits. At least one of the vertical trenches include one or more openings along the horizontal direction to connect the sacrificial layer/insulating layer pairs of adjacent fingers of the same tier. The vertical trenches can be formed by patterning a mask over the stack and etching the portions of the stack exposed by the mask. Further, the sacrificial layers in the stack can be removed using a suitable isotropic etching process such that horizontal trenches can be formed. The horizontal trenches can expose the remaining insulating layers and sidewall portions of the semiconductor channels.

Further, referring to FIGS. 7A-7C, a gate material can be deposited to fill in the horizontal trenches and a gate material layer can be formed over each insulating layer. The portions of the gate material layer deposited in different fingers can form word lines in subsequent steps. The portion of a gate material layer at the location of an opening of a vertical trench can form a connection portion that conductively connects the subsequently-formed word lines adjacent to the opening. In some embodiments, the gate material includes one or more of tungsten, aluminum, and copper, and can be deposited by any suitable deposition method such as CVD, sputtering, and/or ALD. Further, referring to FIGS. 8A and 8B, gate line slits can be formed by depositing a suitable dielectric material into the vertical trenches. A recess etch and/or a CMP process can be used to planarize the top surface of the stack after the dielectric material is deposited.

Further, referring to FIGS. 9A and 9B, excessive gate material on the sidewalls of the stack can be removed (e.g., through a suitable etching process) such that word lines can be formed along the horizontal direction in different fingers. In some embodiments, the stack can include a plurality of fingers aligned horizontally, each fingers including a plurality of word lines stacked vertically. One or more of the plurality of word lines can be conductively connected to other word lines of the same tier through one or more connection portions. In some embodiments, word lines of each tier are conductively connected through one or more conduction portions.

In operation 1103, metal contact vias can be formed on the word lines. FIGS. 9A and 9B illustrate an exemplary structure of this operation. One or more metal contact vias can be formed on the connected word lines to conductively connect the connected word lines with an external circuit. In some embodiments, word lines of the same tier are conductively connected and one metal contact via is formed on one of the word lines.

In various embodiments, the total number of formed metal contact vias is smaller than the total number of word lines. Thus, the number of metal contact vias can be reduced and the fabrication of the three-dimensional memory device can be simplified. The volume of the three-dimensional memory device can be further reduced and the space in the three-dimensional memory device can be more efficiently utilized.

The present disclosure describes various embodiments of three-dimensional NAND memory device and methods of making the same. In some embodiments, the three-dimensional memory device includes an a substrate, a first tier of conductor layers of a first length comprising a first plurality of conductor layers extending along a first direction over the substrate. The first direction is substantially parallel to a top surface of the substrate. The memory device also includes at least one connection portion conductively connecting two or more conductor layers of the first tier, and a first metal contact via conductively shared by connected conductor layers of the first tier and connected to a first metal interconnect.

In some embodiments, the method to form the three-dimensional memory device includes: providing a substrate; forming an alternating stack over the substrate, the alternating stack comprising a plurality of tiers of sacrificial layer/insulating layer pairs extending along a first direction substantially parallel to a top surface of the substrate; forming a plurality of tiers of conductor layers extending along the first direction based on the alternating stack; forming at least one connection portion conductively connecting two or more of the conductor layers of the plurality of tiers of conductor layers; and forming at least one metal contact via conductively shared by connected conductor layers, the at least one metal contact via being connected to at least one metal interconnect.

In some embodiments, the three-dimensional memory device includes a substrate; a plurality of semiconductor channels, wherein one end portion of each of the plurality of semiconductor channels extends a direction substantially perpendicular to a top surface of the substrate; a drain region over the end portion of each of the plurality of semiconductor channels; a plurality of charge storage regions, each charge storage region being surrounded by a respective one of the plurality of semiconductor channels; and a source region in the substrate. The three-dimensional memory device also includes a plurality of bit lines each over a respective end portion of each of the plurality of semiconductor channels; a plurality of word lines extending along a direction substantially parallel to the top surface of the substrate and comprising an upper selective gate, a lower selective gate, and a plurality of word lines between the upper word line and the lower selective gate; a plurality of metal contact vias connecting to the plurality of word lines through a plurality of metal contact vias; and a driver circuit above the plurality of bit lines. Two or more of the plurality of word lines of substantially a same height over the substrate are conductively connected through at least one connection portion of substantially the same height. The two or more of the plurality of word lines share a metal contact via that electrically connects to a respective metal interconnect, the metal contact via being formed on one of the two or more of the plurality of word lines.

The foregoing description of the specific embodiments will so fully reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A memory device, comprising:
   a substrate;
   a stack comprising a first tier over the substrate and a second tier on the first tier, wherein each of the first tier and the second tier comprises gate material layers and insulating layers alternatingly arranged and extending along a first direction; and
   a gate line slit extending along the first direction and dividing the stack into two portions,
   wherein the stack comprises a connection portion that connects the two portions of the stack, the connection portion comprises at least two sub-connection portions along a second direction perpendicular to the first direction, the gate line slit comprises at least two portions along the first direction, and each sub-connection portion is between adjacent two portions of the gate line slit, a first sub-connection portion that connects the gate material layers of the first tier is different from a second sub-connection portion that connects the gate material layers of the second tier.

2. The memory device of claim 1, further comprising:
   a first metal contact via shared by the gate material layers of a first tier.

3. The memory device of claim 2, wherein the first metal contact via conductively connects with the gate material layers of the two portions of the stack.

4. The memory device of claim 1, wherein the sub-connection portion is connected with the gate material layers of a same tier.

5. The memory device of claim 1, wherein a material of the sub-connection portion is same as a material of the gate material layers.

6. The memory device of claim 1, further comprising:
   a source region in the substrate; and
   a source contact via in the gate line slit and connected to the source region, wherein the two portions of the stack are insulated from the source contact via.

7. A memory device, comprising:
   a substrate;
   a stack over the substrate;
   at least one gate line slit extending along a first direction and dividing the stack into at least two portions;
   a source region in the substrate; and
   a source contact via in the at least one gate line slit and connected to the source region,
   wherein the at least two portions of the stack are insulated from the source contact via, the stack comprises at least one connection portion that connects the two portions of the stack, the connection portion comprises at least two sub-connection portions along a second direction perpendicular to the first direction, the gate line slit comprises at least two portions along the first direction, and each sub-connection portion is between adjacent two portions of the gate line slit.

8. The memory device of claim 7, wherein the stack comprises gate material layers and insulating layers alternatingly arranged and extending along the first direction.

9. The memory device of claim 8, further comprising:
   a first metal contact via shared by the gate material layers of a first tier.

10. The memory device of claim 9, wherein the first metal contact via conductively connects with the gate material layers of the two portions of the stack.

11. The memory device of claim 8, wherein the sub-connection portion is connected with the gate material layers of a same tier.

12. The memory device of claim 8, wherein:
   the stack comprises a first tier and a second tier on the first tier; and
   a first sub-connection portion that connects the gate material layers of the first tier is different from a second sub-connection portion that connects the gate material layers of the second tier.

13. The memory device of claim 8, wherein a material of the sub-connection portion is same as a material of the gate material layers.

14. A memory device, comprising:
   a stack on a substrate and comprising gate material layers and insulating layers alternatingly arranged and extending along a first direction;
   a gate line slit extending along the first direction and dividing the stack into two portions;
   a source region in the substrate; and
   a source contact via in the gate line slit and connected to the source region,
   wherein the stack comprises a connection portion that connects the two portions of the stack, the connection portion comprises a plurality of sub-connection portions separating the gate line slit into a plurality of gate line slit sections, and the two portions of the stack are insulated from the source contact via.

15. The memory device of claim 14, wherein:
   the stack comprises a plurality of tiers; and
   each sub-connection portion connects the gate material layers of a corresponding one of the plurality of tiers.

16. The memory device of claim 15, further comprising:
   a first metal contact via shared by the gate material layers of a first tier.

17. The memory device of claim 16, wherein the first metal contact via conductively connects with the gate material layers of the two portions of the stack.

18. The memory device of claim 14, wherein the plurality of sub-connection portions are located in a staircase region.

* * * * *